US006852577B2

United States Patent
Chen

(10) Patent No.: US 6,852,577 B2
(45) Date of Patent: Feb. 8, 2005

(54) METHOD FOR FORMING A LOW TEMPERATURE POLYSILICON CMOS THIN FILM TRANSISTOR

(75) Inventor: Kun-Hong Chen, Taipei Hsien (TW)

(73) Assignee: AU Optronics Corp., Hsin-Chu (TW)

( * ) Notice: Subject to any disclaimer, the term of this patent is extended or adjusted under 35 U.S.C. 154(b) by 0 days.

(21) Appl. No.: 10/463,348

(22) Filed: Jun. 18, 2003

(65) Prior Publication Data

US 2004/0197967 A1 Oct. 7, 2004

(30) Foreign Application Priority Data

Apr. 4, 2003 (TW) ........................................ 92107815 A

(51) Int. Cl.⁷ ............................................. H01L 21/84
(52) U.S. Cl. ........................ 438/163; 438/151; 438/154; 257/350; 257/351
(58) Field of Search ........................ 257/69, 350, 351; 438/151, 154, 163

(56) References Cited

U.S. PATENT DOCUMENTS

| | | | | |
|---|---|---|---|---|
| 6,391,694 B1 | * | 5/2002 | Zhang et al. | 438/164 |
| 6,541,795 B2 | * | 4/2003 | Kusumoto et al. | 257/66 |
| 6,614,052 B1 | * | 9/2003 | Zhang | 257/59 |
| 6,664,149 B2 | * | 12/2003 | Shih | 438/151 |
| 6,734,034 B2 | * | 5/2004 | Shih | 438/30 |
| 6,743,649 B2 | * | 6/2004 | Yamazaki et al. | 438/29 |
| 6,777,254 B1 | * | 8/2004 | Yamazaki et al. | 438/30 |

* cited by examiner

Primary Examiner—Richard Elms
Assistant Examiner—Christian D. Wilson
(74) Attorney, Agent, or Firm—Winston Hsu

(57) ABSTRACT

A method for forming a low temperature polysilicon complementary metal oxide semiconductor thin film transistor (LTPS CMOS TFT). It utilizes six photo-etching processes (PEP) to form the LTPS CMOS TFT that comprises an N type metal oxide semiconductor thin film transistor (NMOS TFT) having lightly doped drains (LDD) and a P type metal oxide semiconductor thin film transistor (PMOS TFT).

31 Claims, 24 Drawing Sheets

METHOD FOR FORMING A LOW TEMPERATURE POLYSILICON CMOS THIN FILM TRANSISTOR

BACKGROUND OF INVENTION

1. Field of the Invention

The present invention relates to a method for forming a low temperature polysilicon complementary metal oxide semiconductor thin film transistor (LTPS CMOS TFT), and more particularly, to a method that utilizes six photo-etching processes to form an LTPS CMOS TFT.

2. Description of the Prior Art

A liquid crystal display is broadly applied to portable electronic apparatuses, such as notebooks and personal digital assistants (PDAs), because of its thin display panel, low power consumption, and low-radiation. As the requirements of high quality displays increase, flat panels with high quality and low price are demanding in the future. LTPS TFT is one of the important technologies for achieving the goal.

An LTPS TFT-LCD includes at least a transparent substrate, a pixel array region, a scan line driving circuit region, and a data line driving circuit region. The pixel array region comprises a plurality of parallel scan lines, a plurality of parallel data lines, and a liquid crystal molecule layer. Each scan line and each data line define a pixel, and each pixel further comprises a TFT and a storage capacitor. Current LTPS TFT-LCD integrates a standard driving IC in a liquid crystal panel by utilizing LTPS CMOS TFT processes, thus the size of displays and the cost can be reduced.

FIGS. 1–9 are schematic diagrams demonstrating a method for forming a top gate LPTS CMOS TFT 56 according to the prior art. As shown in FIG. 1, the LTPS CMOS TFT 56 of the prior art is manufactured on a glass substrate 10, and the glass substrate 10 surface comprises a first region I and a second region II for respectively forming an N type metal oxide semiconductor thin film transistor 52 (NMOS TFT) and a P type metal oxide semiconductor thin film transistor 54 (PMOS TFT) of a driving IC. The glass substrate 10 surface further comprises a pixel array region (not shown in FIG. 1) for forming a plurality of NMOS TFTs arranged in an array to control image display of each pixel.

According to the prior art, an undoped polysilicon layer (not shown in FIG. 1) is first formed on the glass substrate 10, and a first photo-etching process is performed to form a patterned undoped polysilicon layer 12 on both the first region I and the second region II of the glass substrate 10. As shown in FIG. 2, a low temperature deposition process or a thermal oxidization process is performed to form a gate insulating layer 14 on the glass substrate 10 that covers the patterned undoped polysilicon layer 12. Then a photo resist layer (not shown in FIG. 2) is formed on the gate insulating layer 14, and a second photo-etching process is performed to form a patterned photo resist layer 16 in the photo resist layer. Then, a implantation process 18 is performed to implant phosphor ions into the patterned undoped polysilicon layer 12 that is not covered by the patterned photo resist layer 16, such that two N type heavily doped areas 20s and 20d being a source and a drain of the NMOS TFT 52 respectively are formed. Finally the patterned photo resist layer 16 is removed.

As shown in FIG. 3, another photo resist layer (not shown in FIG. 3) is formed on the glass substrate 10, and a third photo-etching process is performed to form a patterned photo resist layer 22 in the photo resist layer. Then an implantation process 24 is performed to implant phosphor ions into the patterned undoped polysilicon layer 12 that is not covered by the patterned photo resist layer to form two N type lightly doped drain (LDD) areas.

As shown in FIG. 4, another photo resist layer (not shown in FIG. 4) is formed on the glass substrate 10 after removing the patterned photo resist layer 22, and a fourth photo-etching process is performed to form a patterned photo resist layer 28. Then an implantation process 30 is performed to implant phosphor ions into the patterned undoped polysilicon layer 12 that is not covered by the patterned photo resist layer 28, such that two P type heavily doped areas 32s and 32d being a source and a drain of the PMOS TFT 54 respectively are formed. The patterned undoped polysilicon layer 12 is used as a channel. Finally the patterned photo resist layer 28 is removed.

As shown in FIGS. 5–7, an aluminum layer (not shown) is formed on the gate insulating layer 14. Then a fifth photo-etching process is performed to form two gate electrodes 34 and 36 on the surface of the gate insulating layer 14, and a interlayer dielectric (ILD) 38, which covers the gate electrodes 34 and 36, is formed on the glass substrate 10. Afterward, a sixth photo-etching process is performed to form a plurality of via holes 40, which reach the sources 20s and 32s, and the drains 20d and 32d respectively, in the interlayer dielectric 38. Following that, a conductive layer (not shown) is formed and filled into the via holes 40. Finally a seventh photo-etching process is performed to remove parts of the conductive layer, such that a source 42s and a drain 42d of the NMOS TFT 52 and a source 44s and a drain 44d of the PMOS TFT 54 are formed.

As shown in FIGS. 8 and 9, a passivation layer 46 is performed on the glass substrate 10, and a eighth photo-etching process is performed to form a plurality of contact holes 48, which reach the sources 42s and 44s, and the drains 42d and 44d, in the passivation layer 46. Finally a transparent conductive layer 50 is performed on the glass substrate 10, and a ninth photo-etching process is performed to remove parts of the transparent conductive layer 50, such that the NMOS TFT 52 and the PMOS TFT 54 are formed.

According to the method for forming the LTPS CMOS TFT of the prior art, nine photo-etching processes are performed to respectively define the patterned polysilicon layer, the source and drain of the NMOS TFT, the LDD of the NMOS TFT, the source, drain, and gate of the PMOS TFT, the via holes, source, and drain of the interlayer dielectric, the contact holes of the passivation layer, and the pattern of the transparent conductive layer. Therefore, the entire process is complex and takes a lot of time. Furthermore, the alignment deviation occurs easily because of excessive photo-etching processes.

SUMMARY OF INVENTION

It is therefore an object of the present invention to provide a simplified method for forming a low temperature polysilicon complementary metal oxide semiconductor thin film transistor (LTPS CMOS TFT).

It is another object of the present invention to provide a method for forming an LTPS CMOS TFT by using merely six photo-etching processes.

According to the present invention, a method for forming an LTPS CMOS TFT on a substrate is introduced. The substrate surface comprises a first region and a second region for forming a first type MOS TFT and a second type MOS TFT respectively. First a patterned undoped polysilicon is formed on both the first region and the second region of the substrate, and a gate insulating layer is formed on each patterned undoped polysilicon layer. Then two first conductive doped areas are formed in the patterned polysilicon layer of the first region that is not covered by the gate insulating layer, and two second conductive doped areas are formed in the patterned polysilicon layer of the second region that is not covered by the gate insulating layer. Afterward, a gate electrode is formed on each gate insulating layer, a source and a drain are formed on both the two first type doped areas and the two second type doped areas, and two first type lightly doped drains are formed in the patterned undoped polysilicon layer that is not covered by the gate electrode, source, and drain of the first region. Finally a patterned interlayer dielectric, which comprises a plurality of via holes formed above each source and drain, is formed on the substrate, and a transparent conductive layer is filled into the via holes.

According to the method for forming LTPS CMOS TFTs of the present invention, six photo-etching processes are performed to respectively define the patterned polysilicon layer and the gate insulating layer, the source and drain of the NMOS TFT, the gate electrode, source layer, drain layer, and lightly doped drain of the NMOS CMOS TFT, the via holes of the interlayer dielectric, and the pattern of the transparent conductive layer. Furthermore, the present invention provides a method for forming a lightly doped drain that can be self-aligned.

It is an advantage of the present invention that the entire process and the cost are reduced. Moreover, the alignment deviation can be avoided because of less photo-etching processes are performed.

These and other objects of the present invention will be apparent to those of ordinary skill in the art after having read the following detailed description of the preferred embodiment that is illustrated in the various figures and drawings.

DETAILED DESCRIPTION

In a preferred embodiment of the present invention, a method for forming a top gate low temperature polysilicon complementary metal oxide semiconductor thin film transistor (LTPS CMOS TFT) is introduced. However, the application of the present invention is not limited by this embodiment, the present invention can also be applied to form scan lines, data lines, storage capacitors of an LTPS TFT-LCD, or other LTPS CMOS TFTs.

Figure 1:
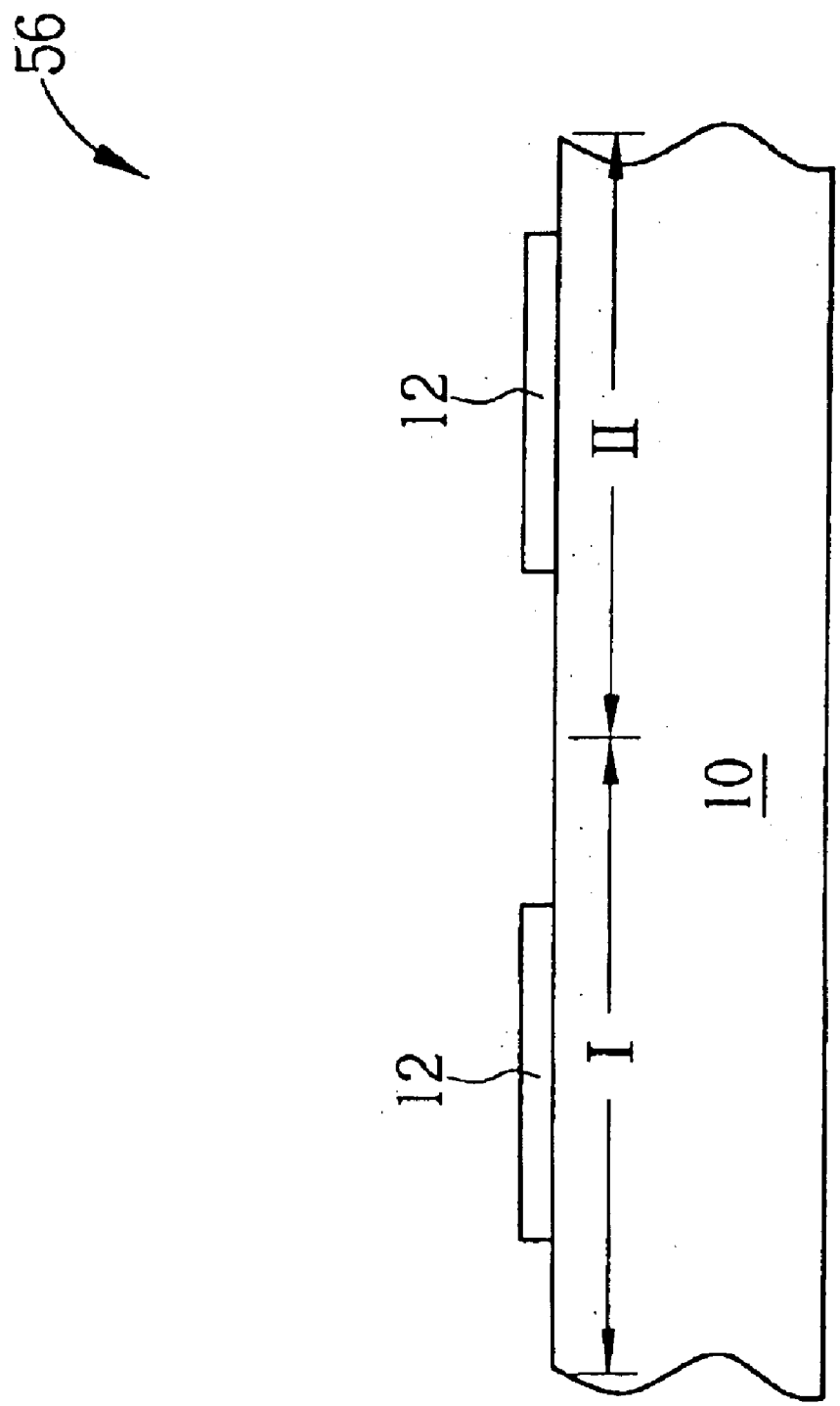
FIGS. 1–9 are schematic diagrams demonstrating a method for forming an LPTS CMOS TFT according to the prior art.
Figure 2:
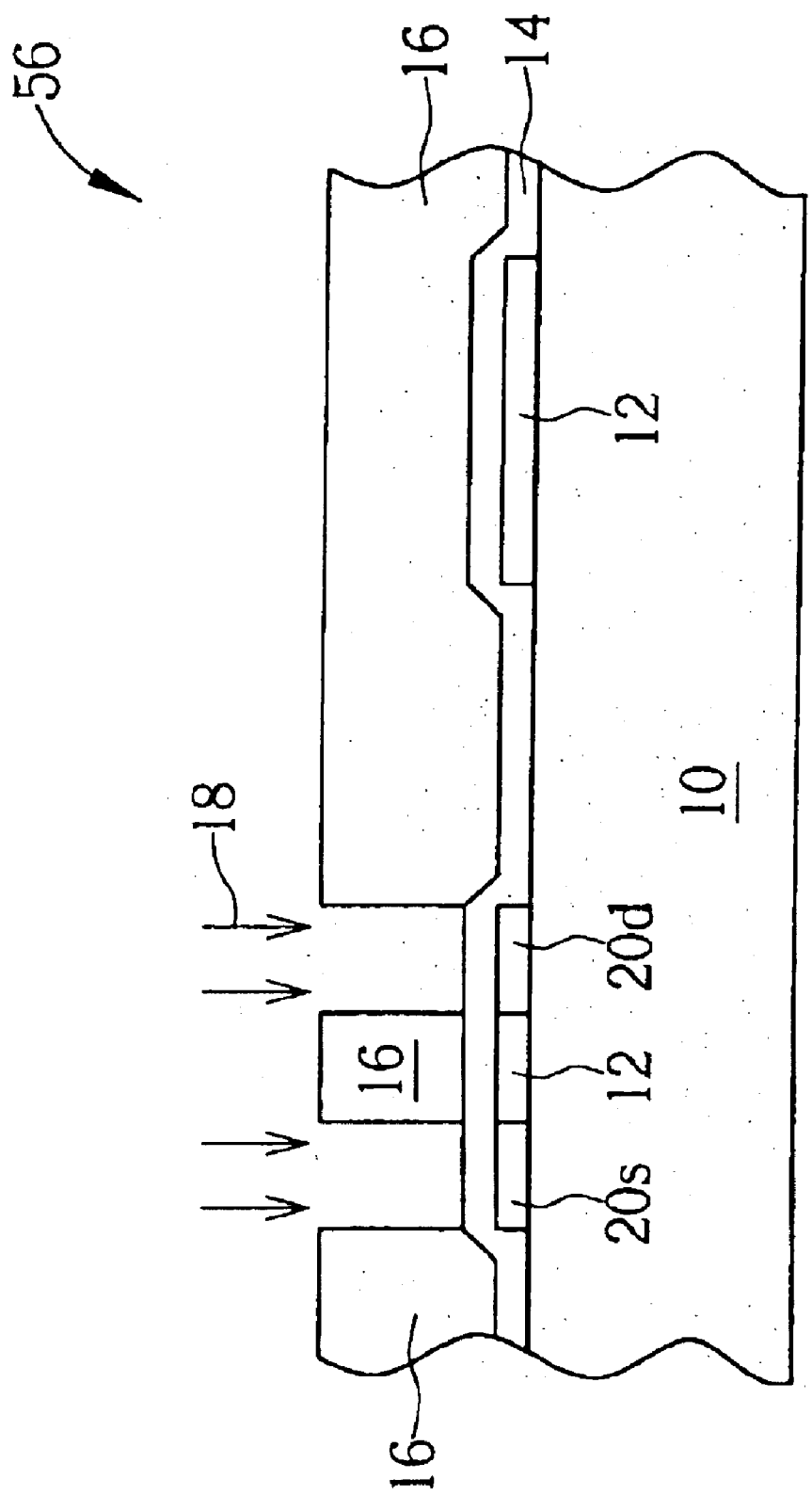
Figure 3:
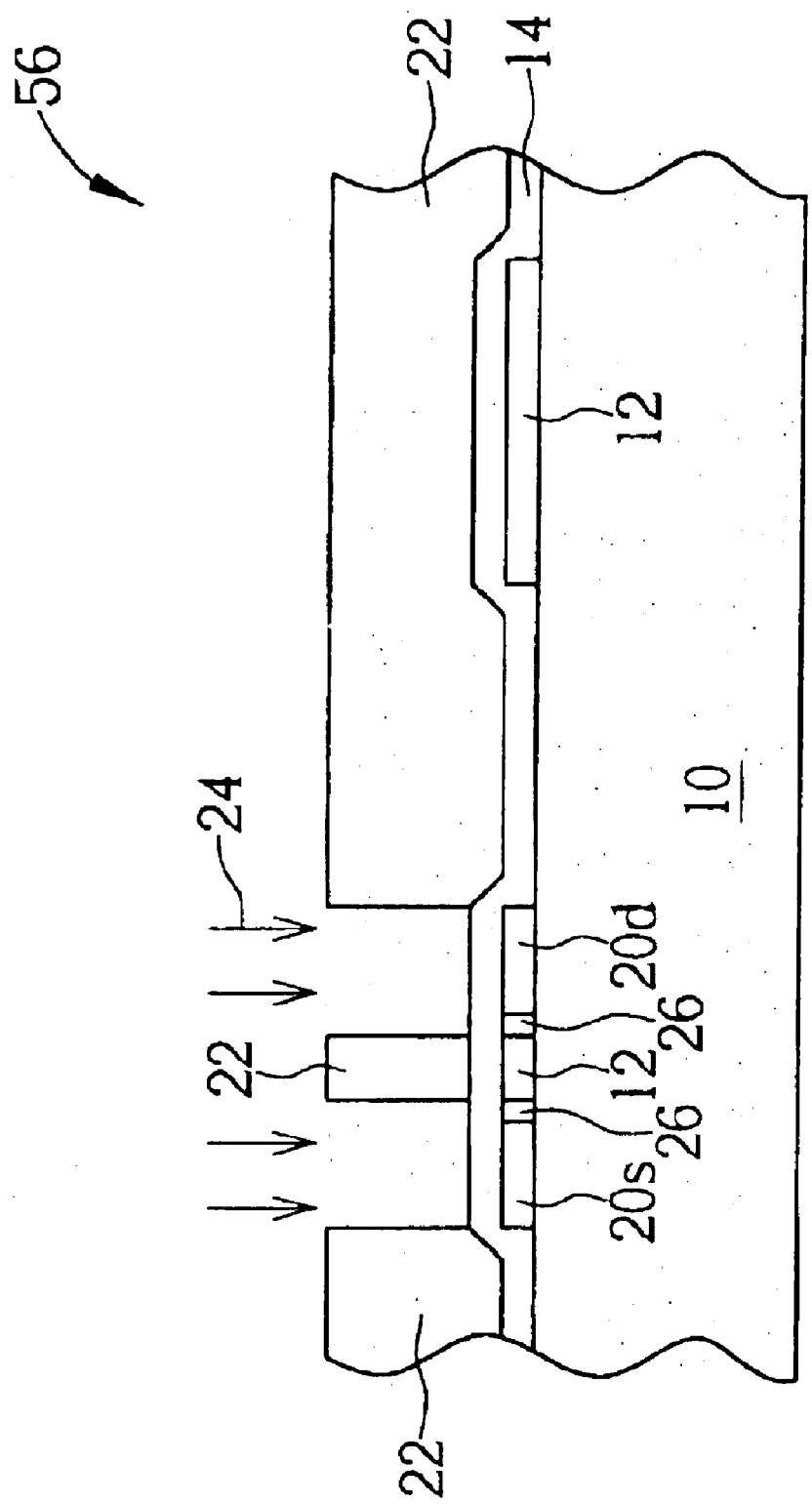
Figure 4:
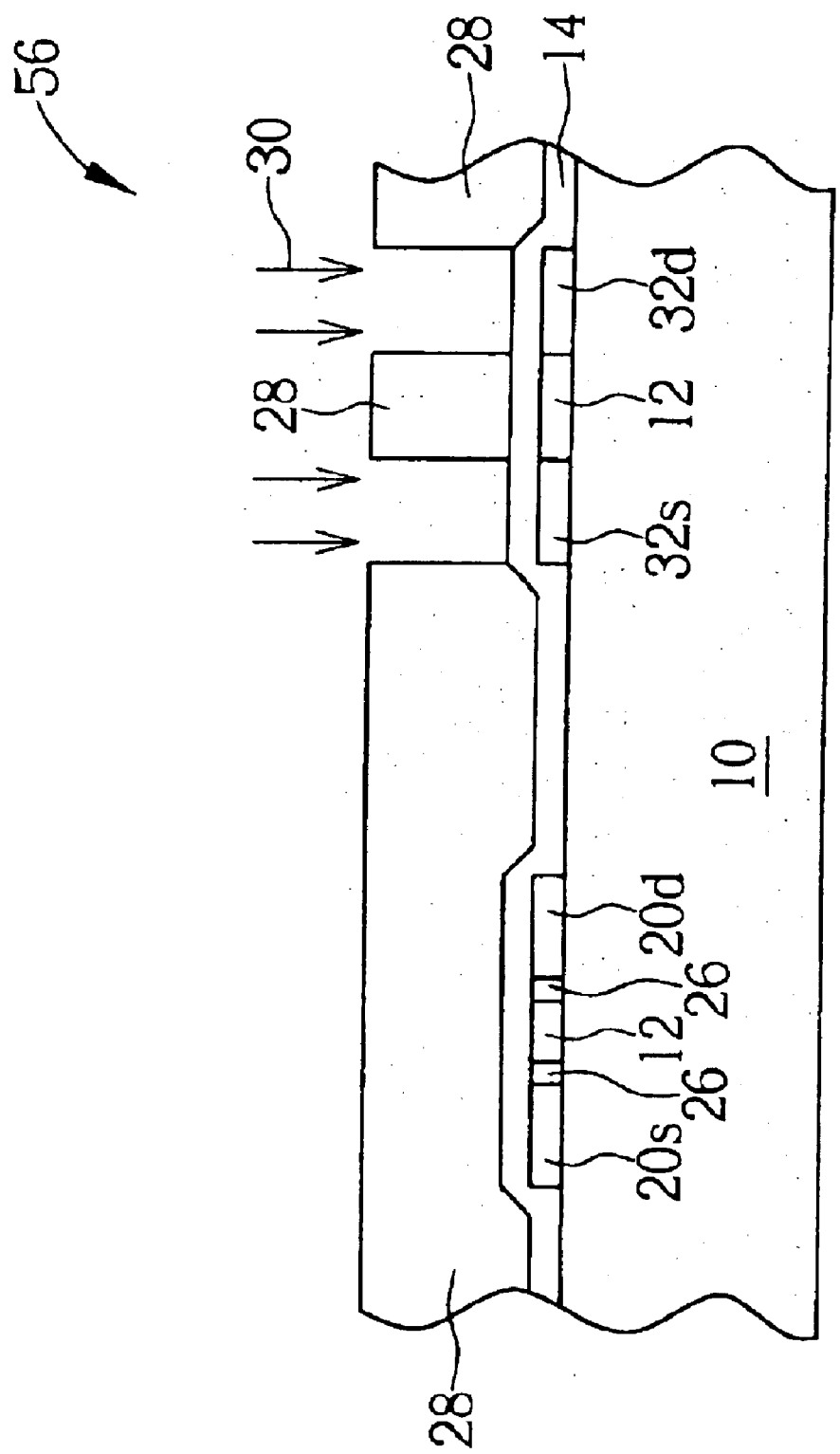
Figure 5:
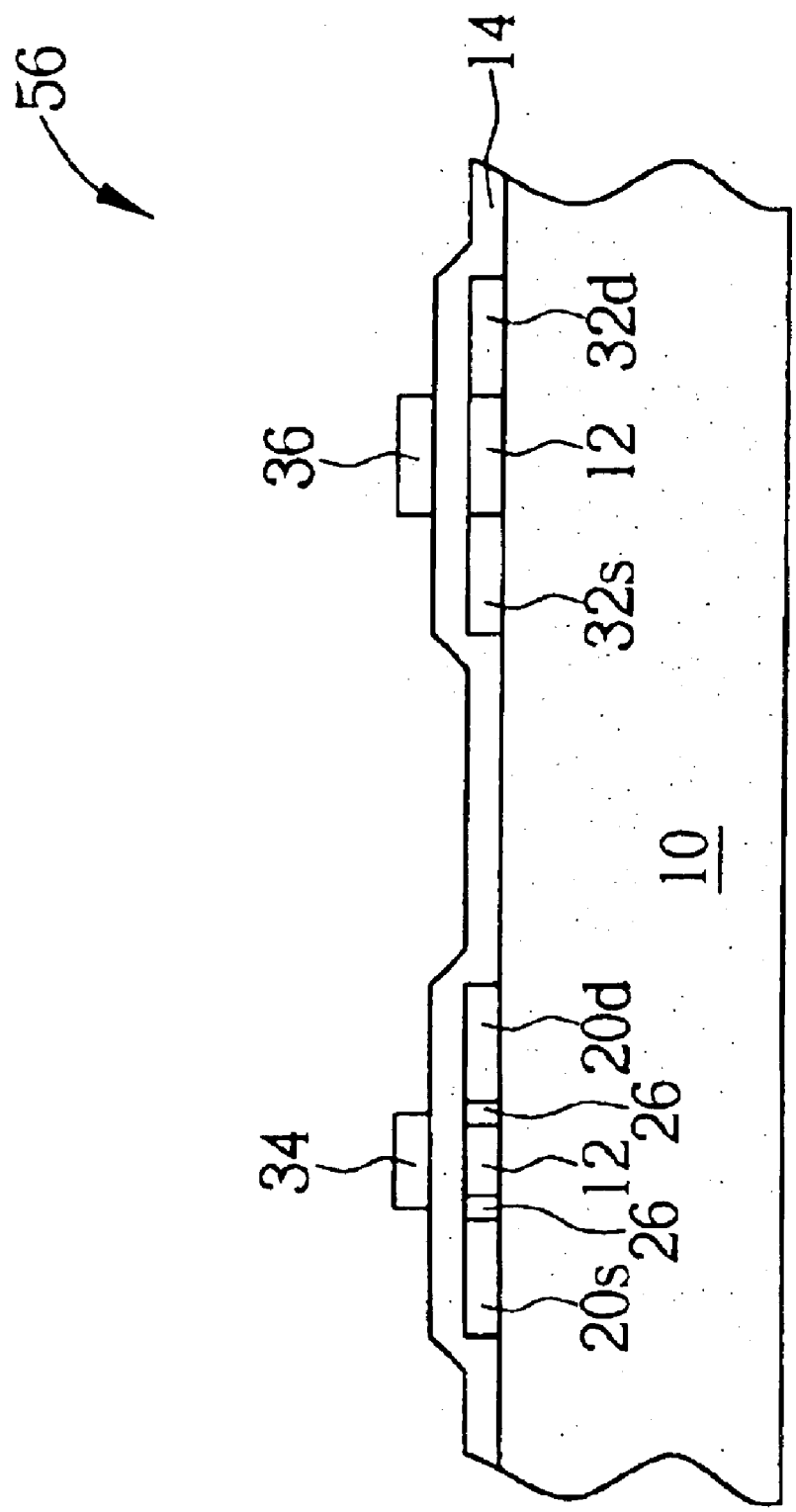
Figure 6:
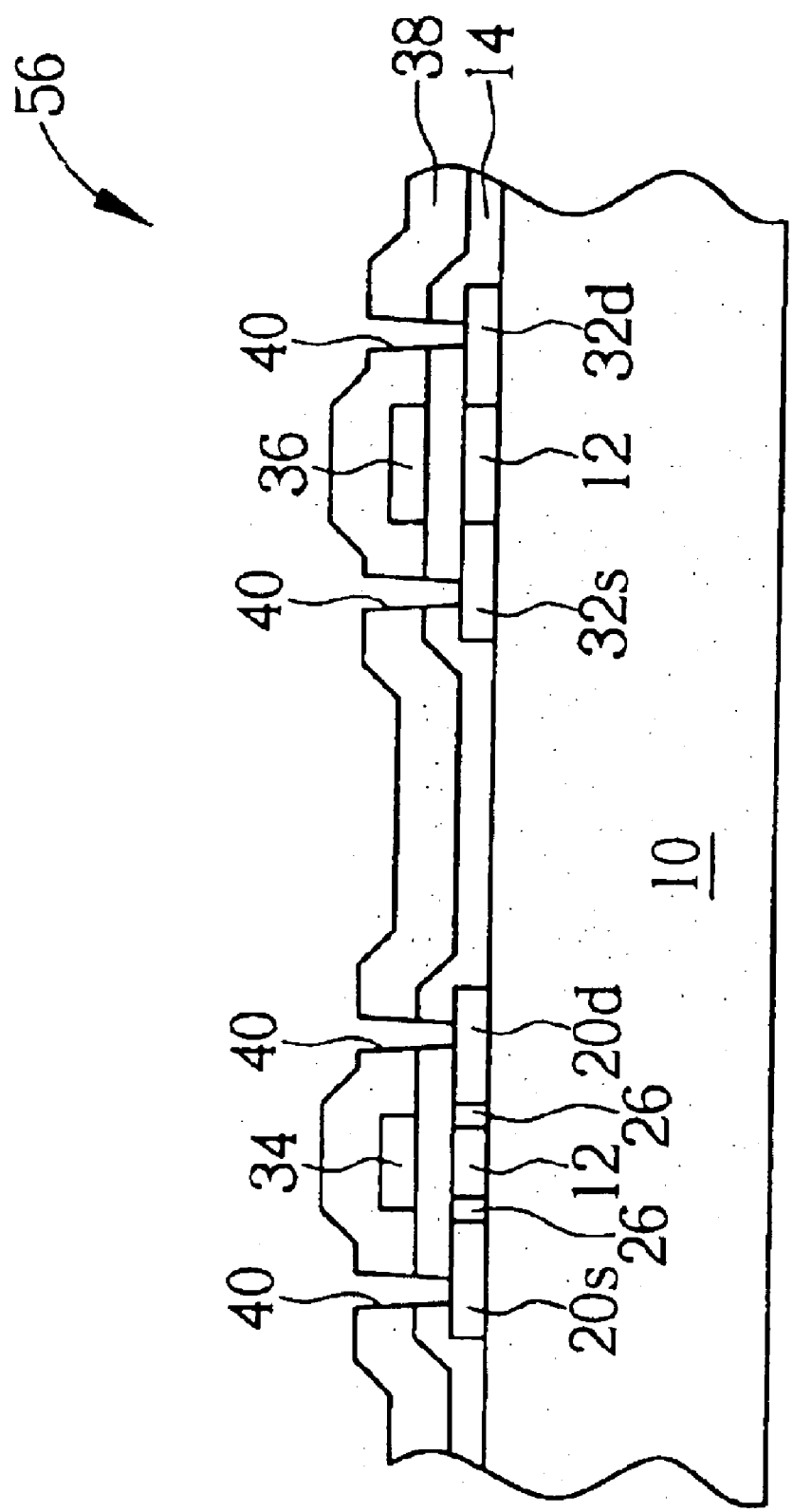
Figure 7:
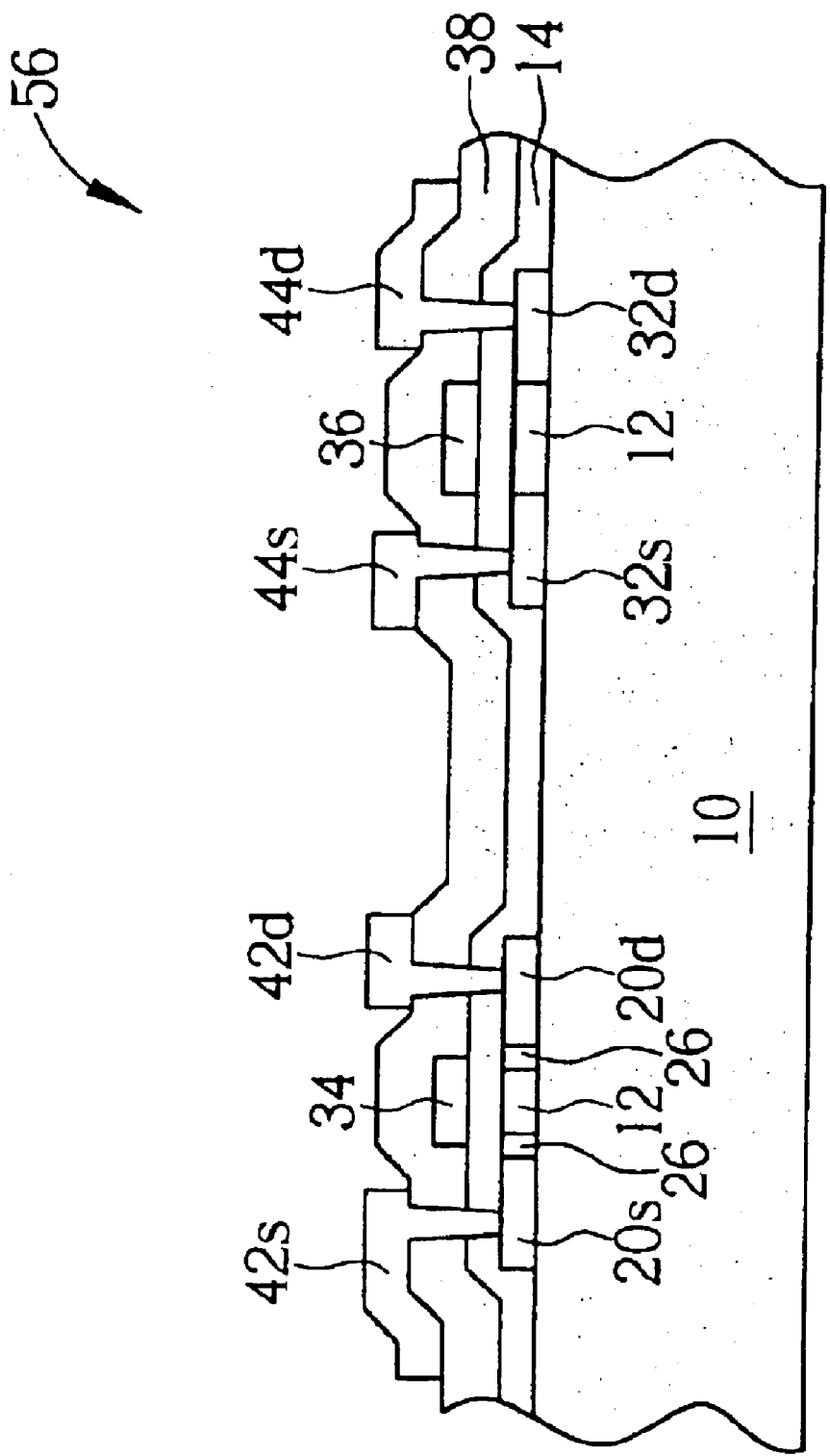
Figure 8:
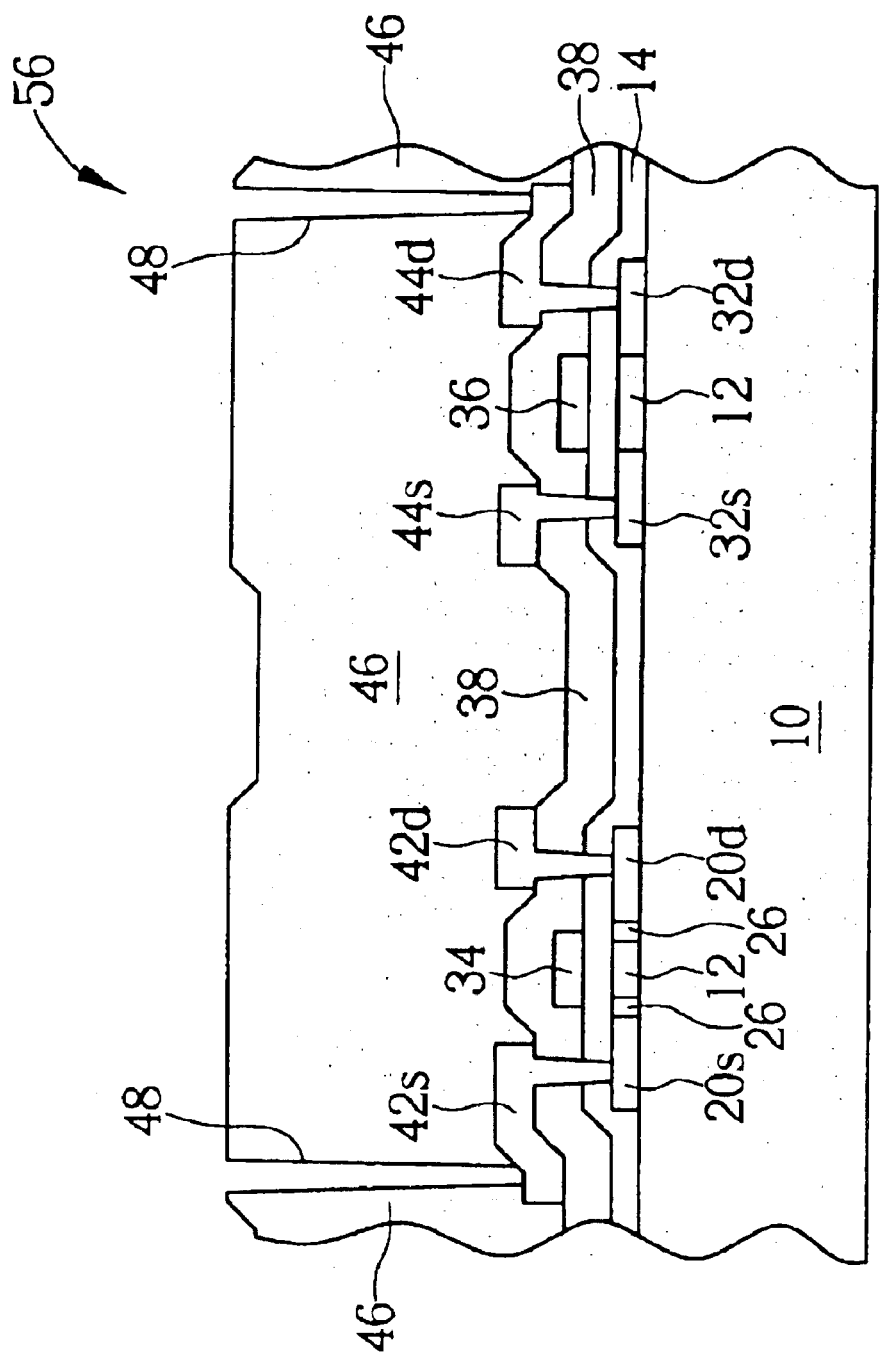
Figure 9:
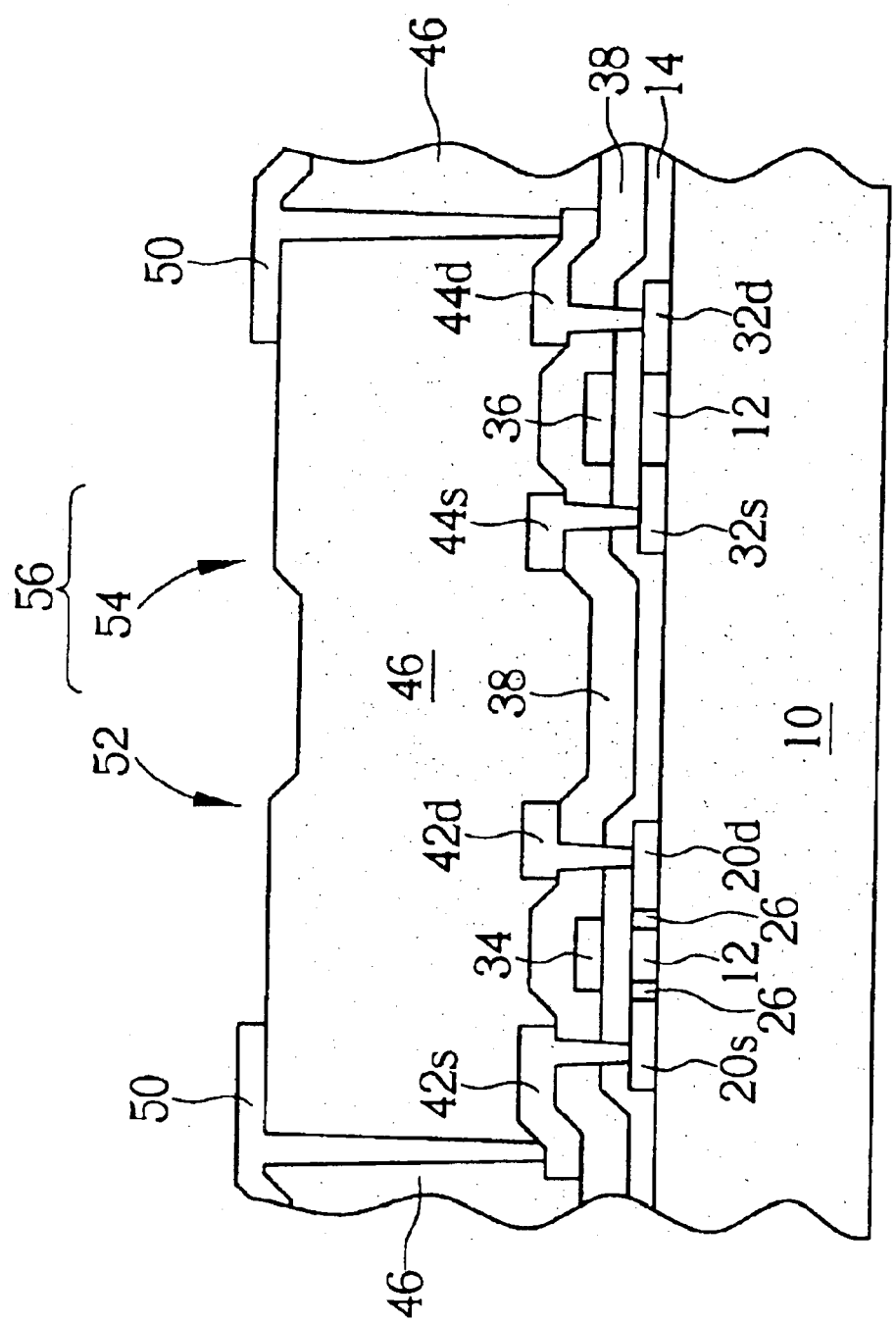
Figure 10:
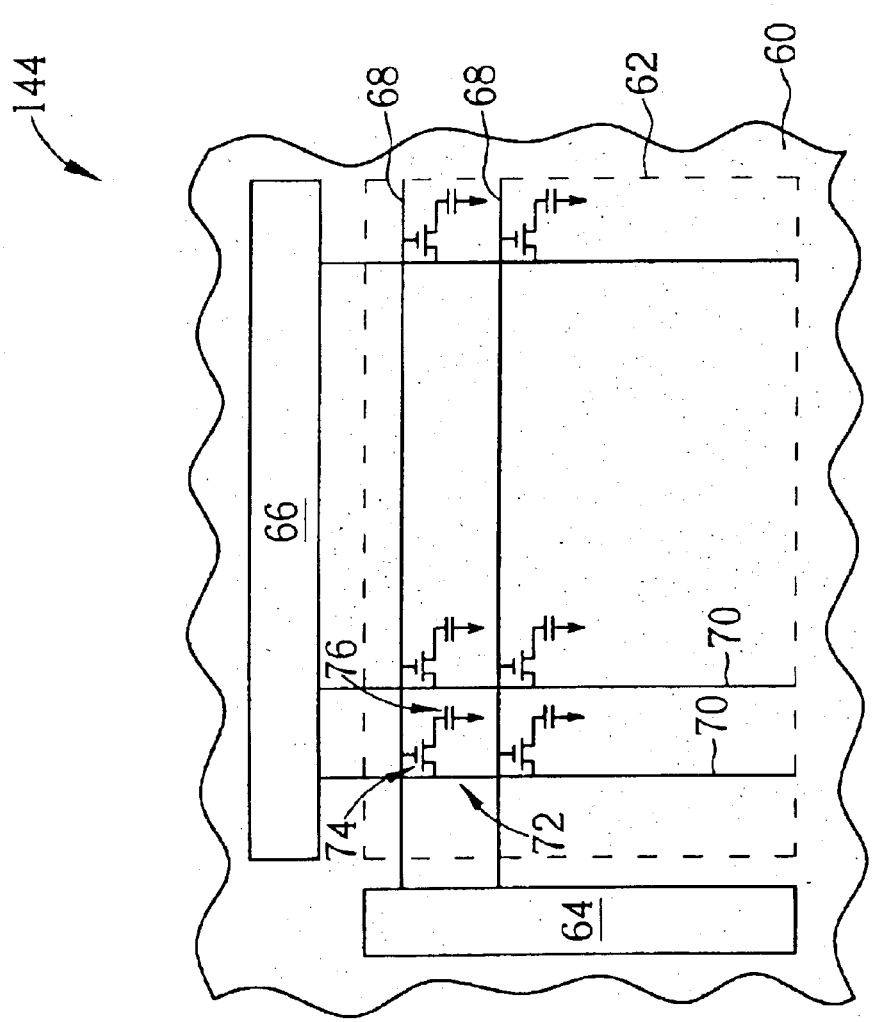
FIGS. 10–24 are schematic diagrams demonstrating a method for forming an LPTS CMOS TFT according to the present invention.
Figure 17:
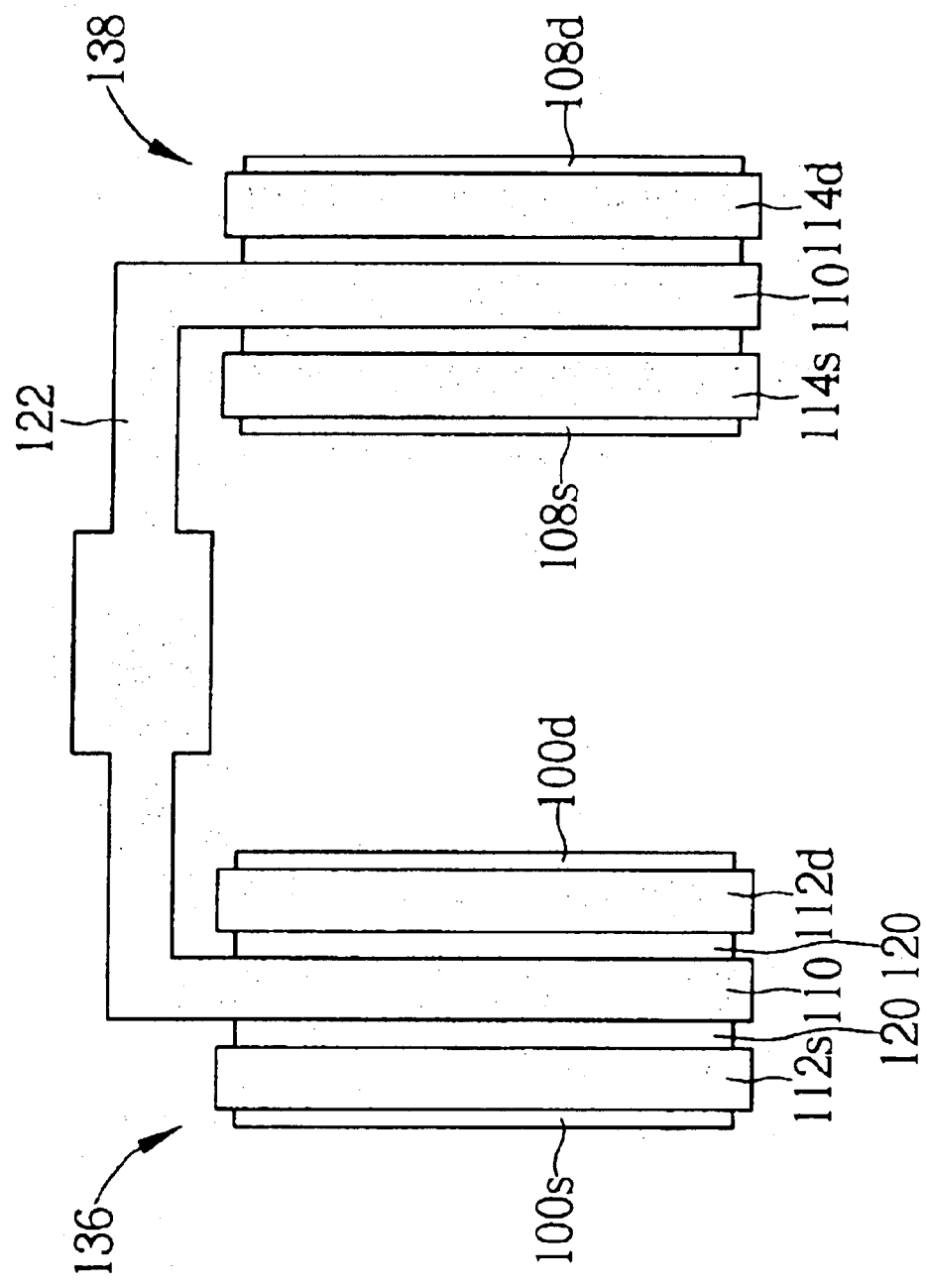
Figure 18:
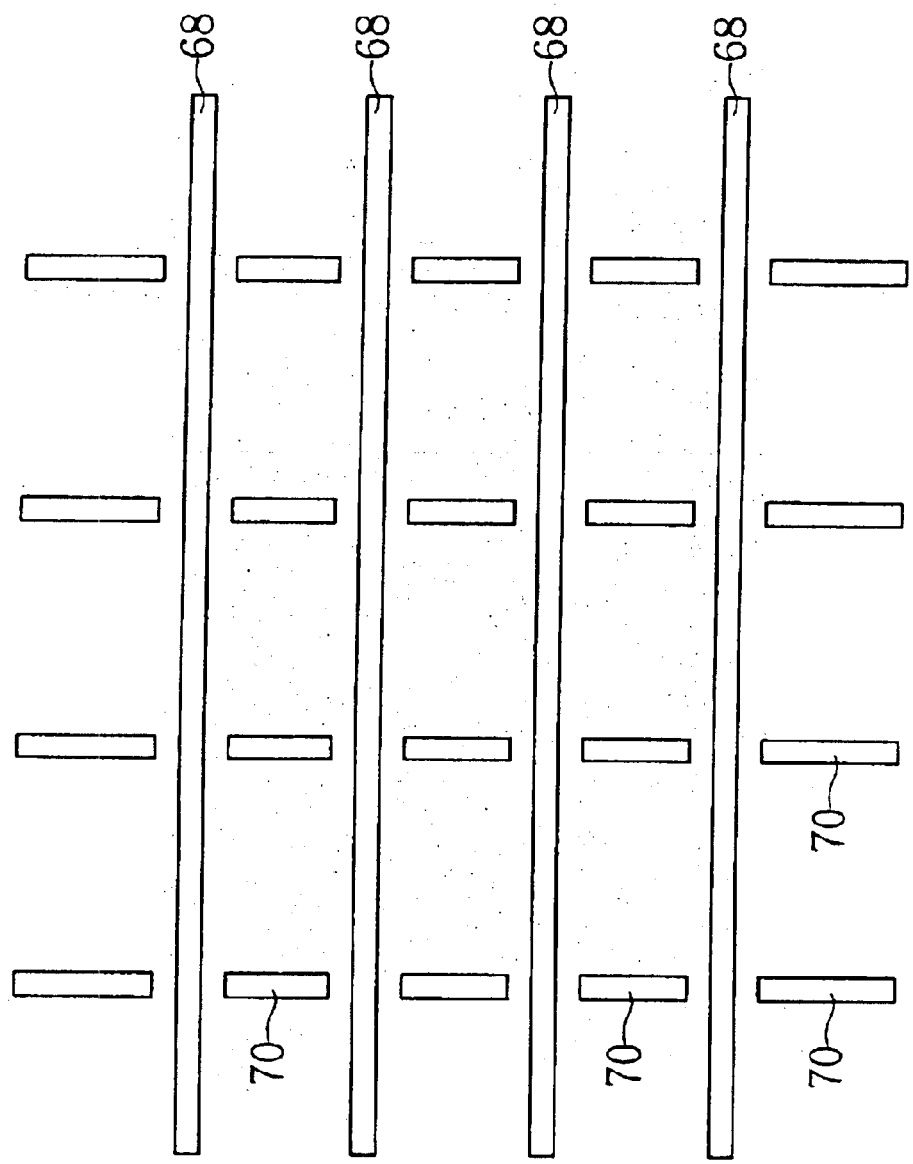

FIG. 10 is a schematic diagram of an LTPS TFT-LCD 144 of the present invention. FIGS. 11–24 are schematic diagrams demonstrating a method for forming an LTPS CMOS TFT 140 according to the present invention. FIG. 17 is a top view of the LTPS CMOS TFT 140 shown in FIG. 16; FIG. 20 is a top view of the LTPS CMOS TFT 140 shown in FIG. 19; FIG. 23 is a top view of the LTPS CMOS TFT 140 shown in FIG. 22; and FIGS. 18, 20, and 24 are top views of FIG. 10.

As shown in FIG. 10, the LTPS TFT-LCD 144 includes a glass substrate 60, and the surface of the glass substrate 60 comprises a pixel array region 62, a scan line driving circuit region 64, and a data line driving circuit region 66. The pixel array region 62 comprises a plurality of parallel scan lines 68, a plurality of parallel data lines, and a liquid crystal molecule layer (not shown in FIG. 10). Each scan line 68 and each data line 70 define a pixel 72, and each pixel 72 further comprises a TFT 74 and a storage capacitor 76. Furthermore, the scan line driving circuit region 64 and the data line driving circuit region 66 each includes a plurality of LTPS CMOS TFTs 140 as logic circuit elements.

Figure 11:
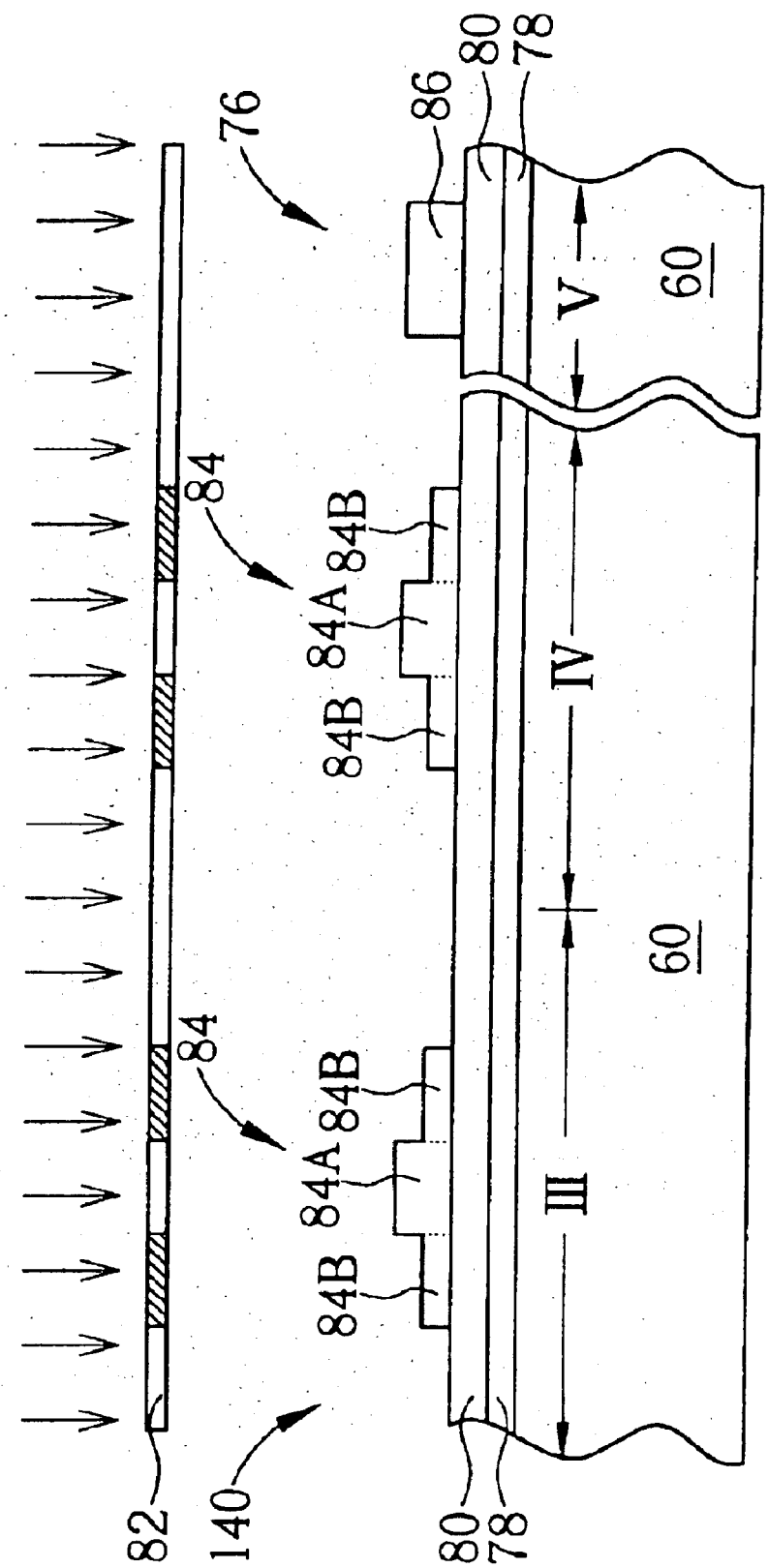

As shown in FIG. 11, the LTPS CMOS TFT 140 of the present invention is formed on the glass substrate 60, and the surface of the glass substrate 60 comprises an NMOS TFT region III, a PMOS TFT region IV, and a capacitor region V for forming an NMOS TFT 136, a PMOS TFT, and a storage capacitor 76 respectively. Depending on the requirement, the NMOS TFT 136 and the PMOS TFT 138 can be redesigned and replaced by the CMOS TFT 140 or the TFT 74 of the pixel 72, and the storage capacitor 76 can also be redesigned as well.

Figure 12:
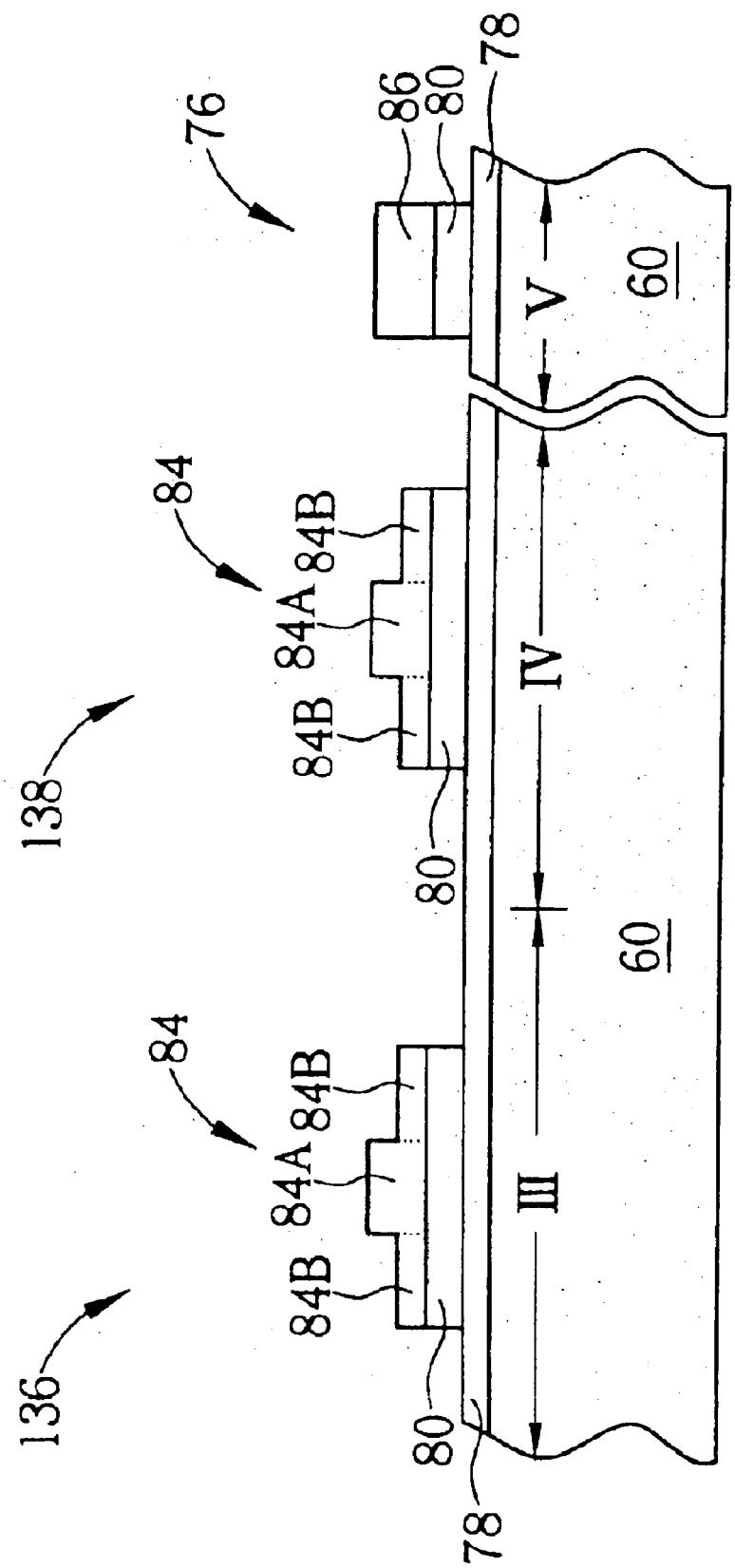
Figure 13:
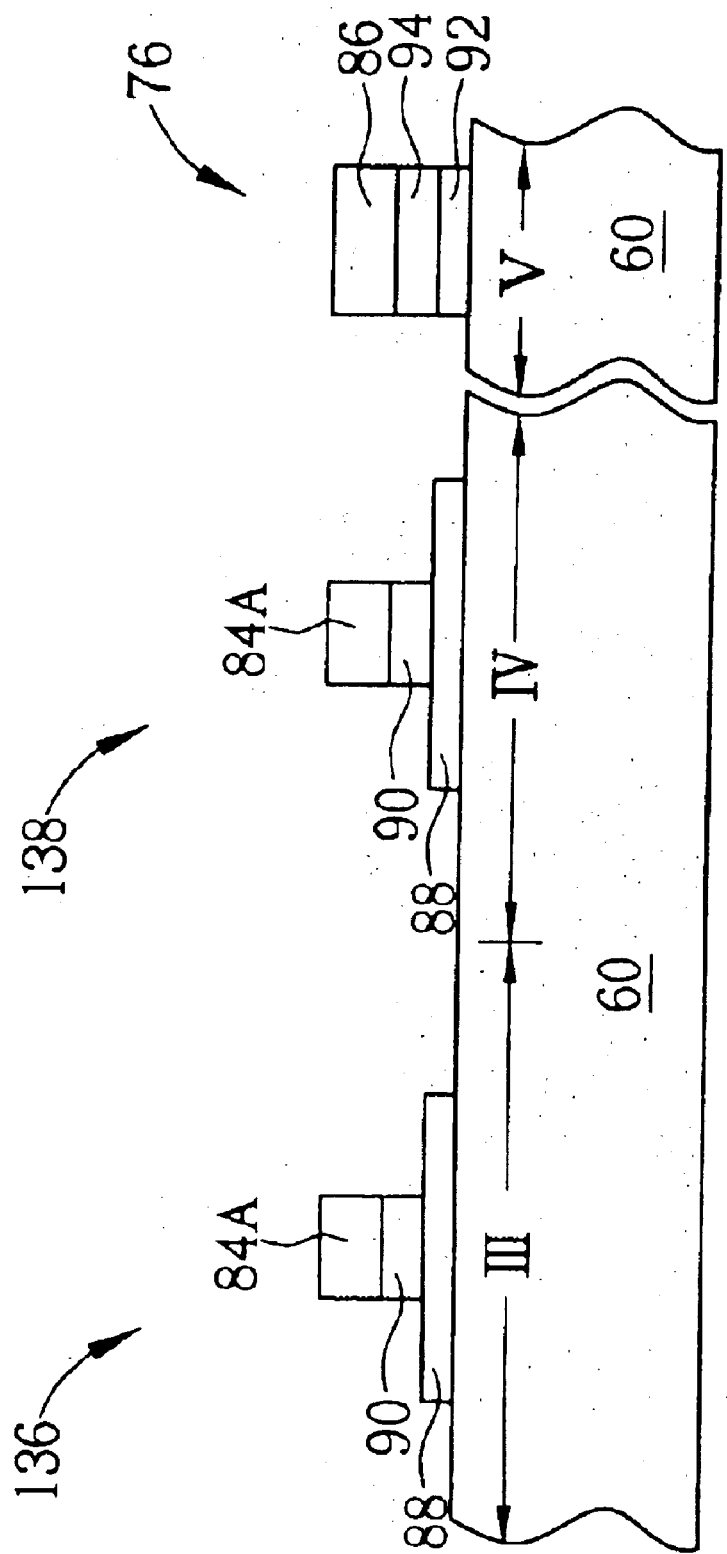

In the present invention, first a undoped polysilicon layer 78, a silicon oxide layer 80, and a photo resist layer (not shown in FIG. 11) are deposited in order on the glass substrate 60. The thickness of the undoped polysilicon layer 78 is about 400 Å to 600 Å (angstrom), and the thickness of the silicon oxide layer 80 is about 600 Å to 1200 Å. Then a first photo-etching process is performed by an attenuating phase shift mask 82, such as a slit mask or a mask having a translucent region, to form patterned photo resist layers 84 and 86 on the NMOS TFT region III, the PMOS TFT region IV, and the storage capacitor region V respectively. Each patterned photo resist layer 84 includes a central region 84A and two edge regions 84B, and the thickness of the edge region 84B is smaller than the thickness of the central region 84A. As shown in FIGS. 12 and 13, the silicon oxide layer 80 that is not covered by the patterned photo resist layers 84 and 86 is removed, the edge regions 84B of the patterned photo resist layer 84 are removed, and the silicon oxide layer 80 that is not covered by the central region 84A of the patterned photo resist layer 84 is removed. In this case a patterned undoped polysilicon layer 88 and a gate insulating layer 90 are formed on the NMOS TFT region III and the PMOS TFT region IV, and simultaneously a undoped polysilicon layer 92 and a capacitor dielectric layer 94 of the storage capacitor 76 are formed on the capacitor region V. a buffer layer (not shown) can be selectively formed between the glass substrate 60 and the undoped polysilicon layer 78 to protect the glass substrate 60.

Figure 14:
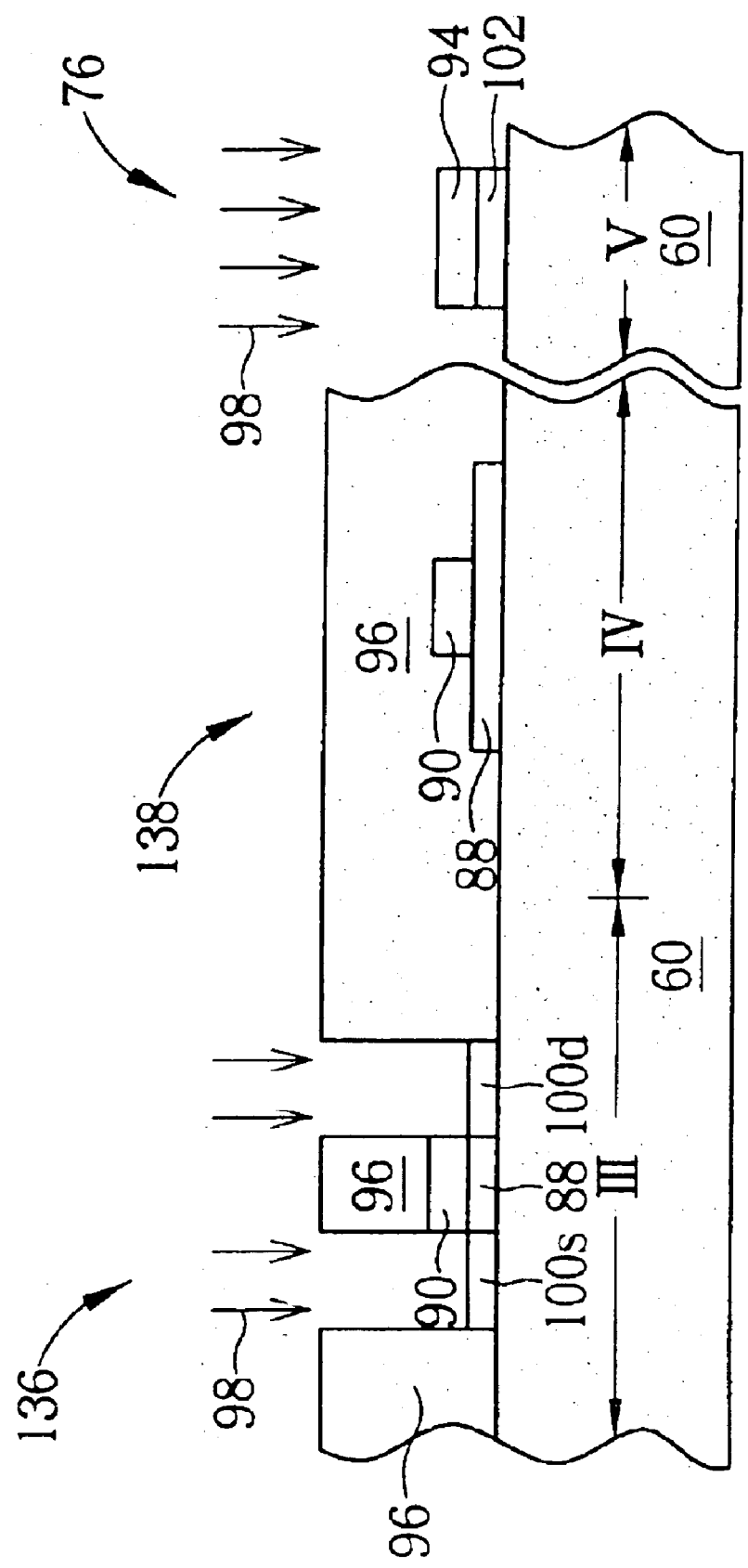

As shown in FIG. 14, after removing the remaining patterned photo resist layers 84 and 86, another photo resist layer (not shown in FIG. 14) is formed on the glass substrate 60. A second photo-etching process is performed to form a patterned photo resist layer 96 covering the PMOS TFT region V and the gate insulating layer 90 of the NMOS TFT region III. Then an implantation process 98 is performed by using the patterned photo resist layer 96 as a mask to implant phosphor ions into the undoped polysilicon layer 88 that is not covered by the patterned photo resist layer 96, such that two N type heavily doped area 100s and 100d being a source and a drain of the NMOS TFT 136 respectively are formed, and simultaneously a bottom plate of the capacitor 76 is formed in the undoped polysilicon layer 92 of the capacitor region V. Finally, the patterned photo resist layer 96 is removed. The dopant concentration in the implantation process 98 is about 1E14 to 1E16 atoms/cm$^2$.

Figure 15:
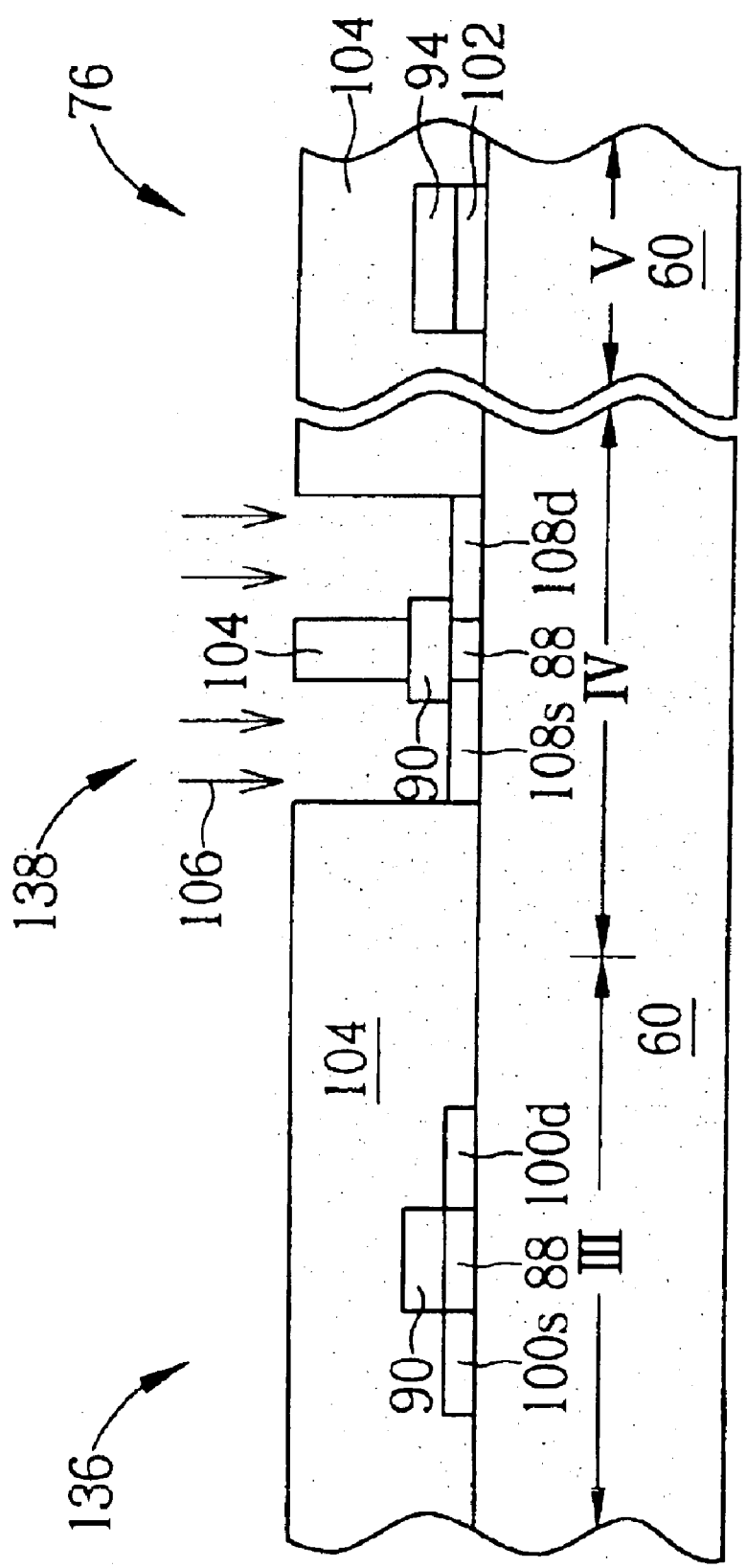

As shown in FIG. 15, another photo resist layer (not shown in FIG. 15) is formed on the glass substrate 60, and a third photo-etching process is performed to form a patterned photo resist layer 104 covering the NMOS TFT region III, the capacitor region V, and parts of the gate insulating layer 90 on the PMOS TFT region IV. Then an implantation process 106 is performed to implant boron ions into the patterned undoped polysilicon layer 88 that is not covered by the patterned photo resist layer 104, such that two P type heavily doped area 108s and 108d being a source and a drain of the PMOS TFT 138 respectively are formed. Then the patterned photo resist layer 104 is removed. The dopant concentration in the implantation process 106 is about 1E14 to 1E16 atoms/cm$^2$.

Figure 16:
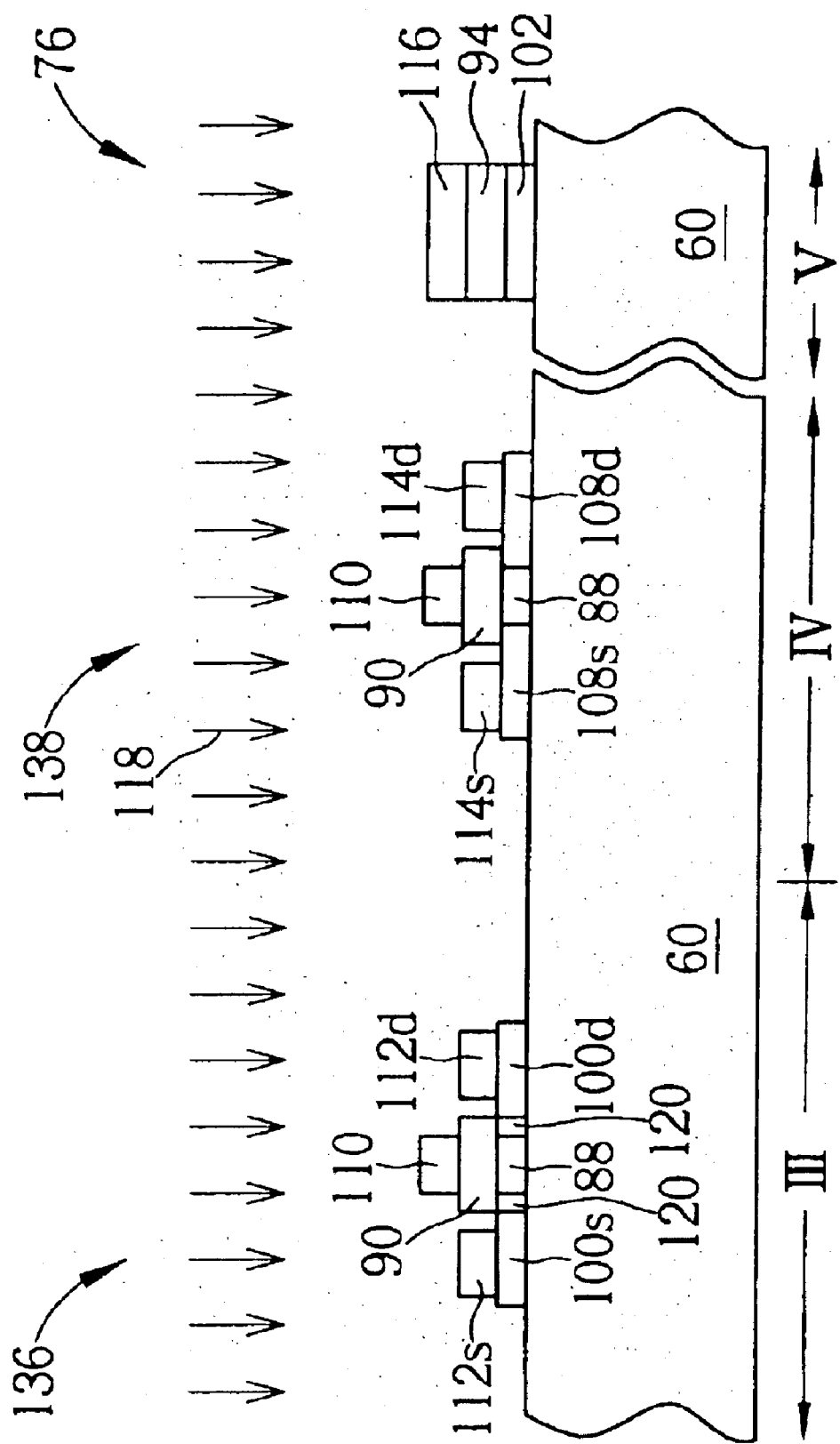

As shown in FIG. 16, a conductive layer (not shown in FIG. 16) is formed on the glass substrate 60. Then a fourth photo-etching process is performed to form a gate electrode in the conductive layer on both gate insulating layers 90, and to form source layers 112s and 114s, and drain layers 112d and 114d in the conductive layer on both the two N type heavily doped areas 110s and 110d, and both the two P type heavily doped areas 108s and 108d. Simultaneously a top conductive layer 116 of the capacitor 76 is formed on the capacitor region V. Afterward, an implantation process 118 is performed by utilizing the gate electrode 110, the source layer 112s, and the drain layer 112d as a mask to implant phosphor ions into the patterned undoped polysilicon layer 88 on the NMOS TFT region III, such that two lightly doped drains 120 are formed. The dopant concentration in the implantation process 118 is about 1E12 to 1E14 atoms/cm$^2$. It is noted that the width of each gate electrode 110 is smaller than the width of the gate insulating layer 90 below the gate electrode 110, and the width of each source layer 112s and 114s, and each drain layer 112d and 114d is smaller than the width of the N type heavily doped areas 100s and 100d, and the P type heavily doped areas 108s and 108d.

As shown in FIGS. 17 and 18, when the gate electrode 110, the source layers 112s and 114s, and the drain layers 112d and 114d are formed, a metal conductive wire 122 is simultaneously formed between the NMOS TFT 136 and the PMOS TFT 138 on the glass substrate 60 to connect the two gate electrodes 110. Also a plurality of scan lines 68, and a plurality of data lines 70 orthogonal to the scan lines 68 are formed on the glass substrate 60. As shown in FIG. 18, each scan line is a continuous line, while each data line is a discontinuous line, such that the scan lines 68 and the data lines 70 are not connected. Similarly, each data line 70 can be a continuous line, while each scan line 68 can be a discontinuous line. In addition, the material of the conductive layer, the metal conductive wire 122, the scan lines 68, or the data lines 70 comprises aluminum, wolfram, or chromium.

Figure 19:
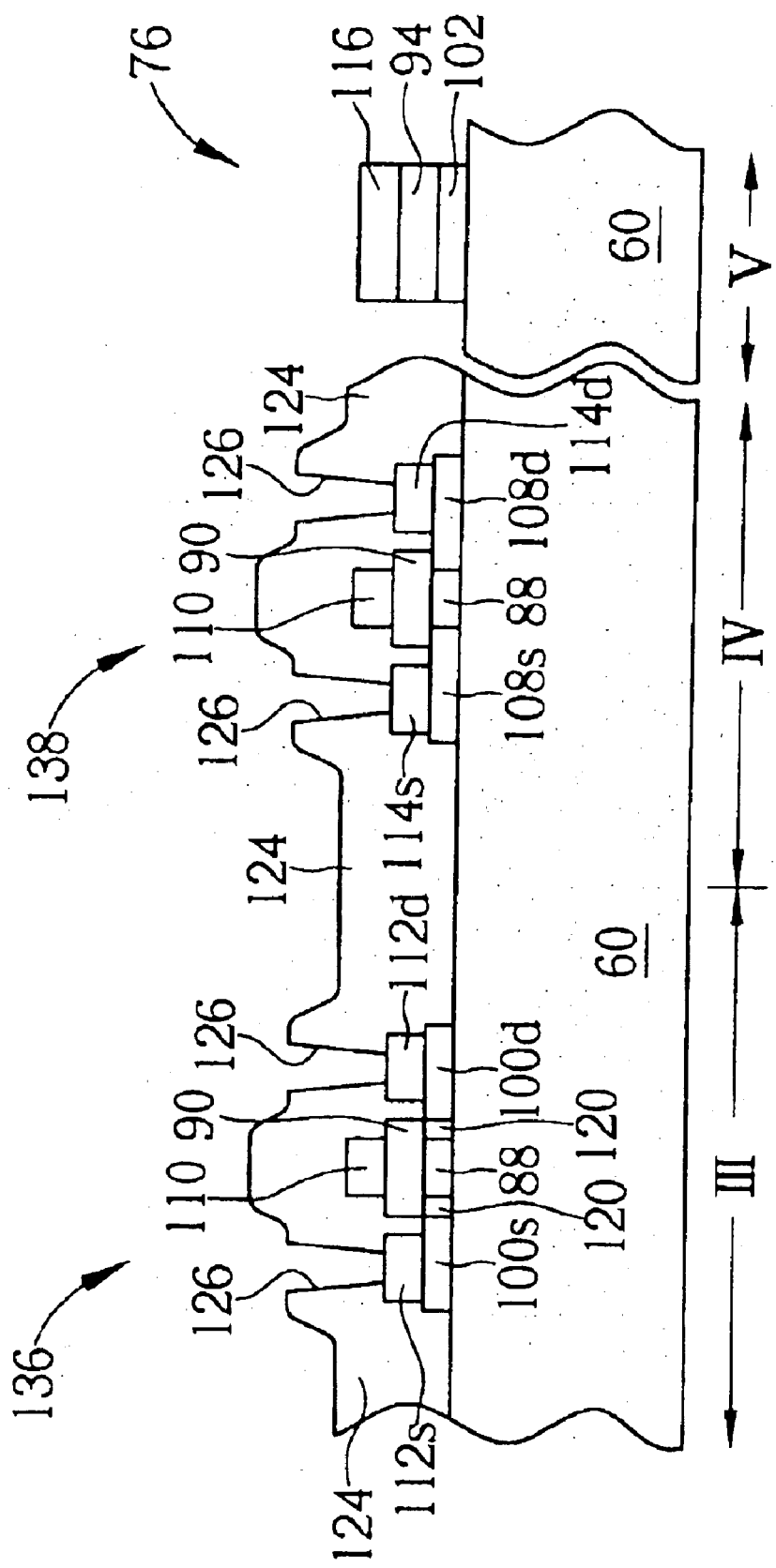
Figure 20:
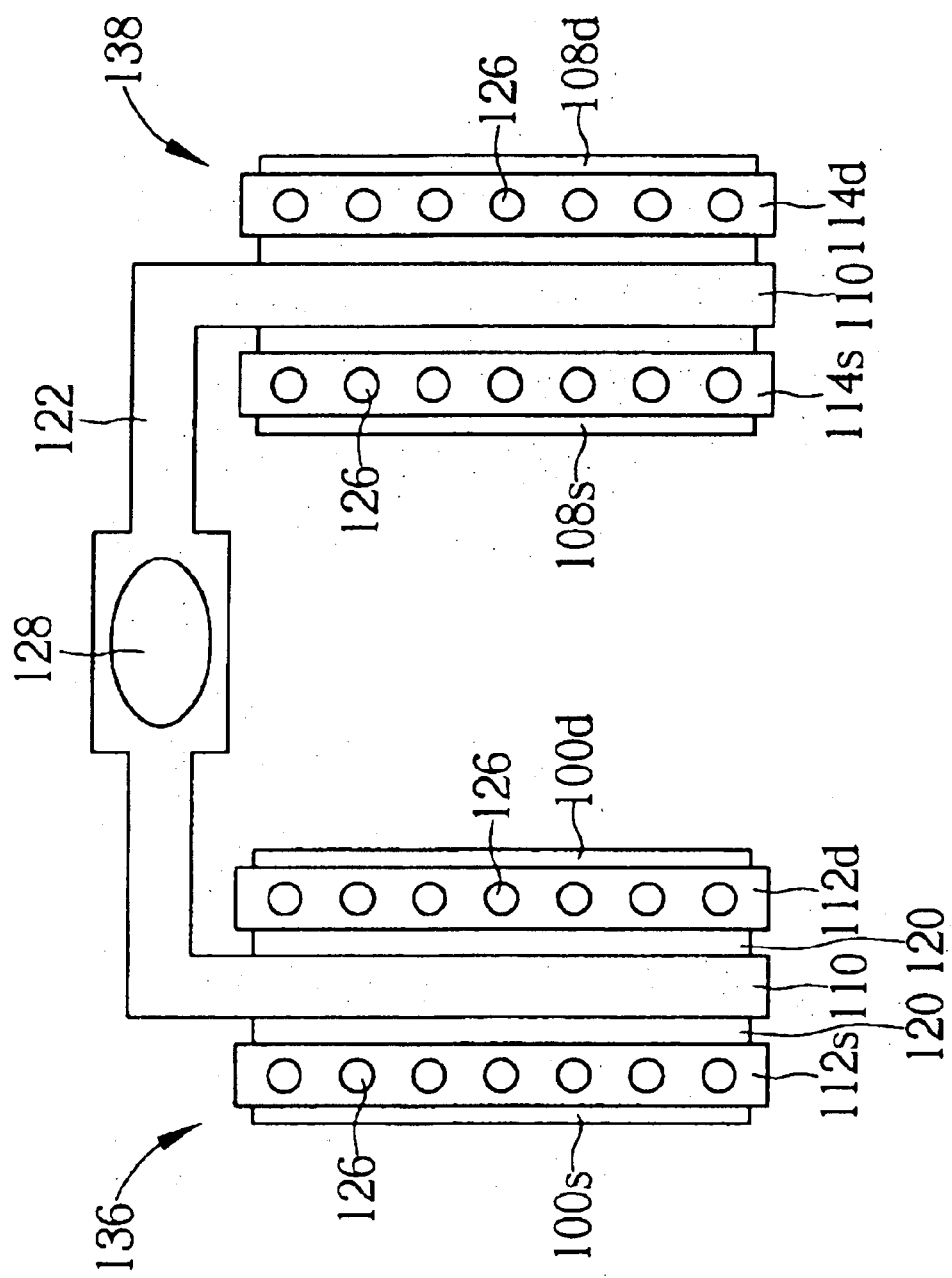
Figure 21:
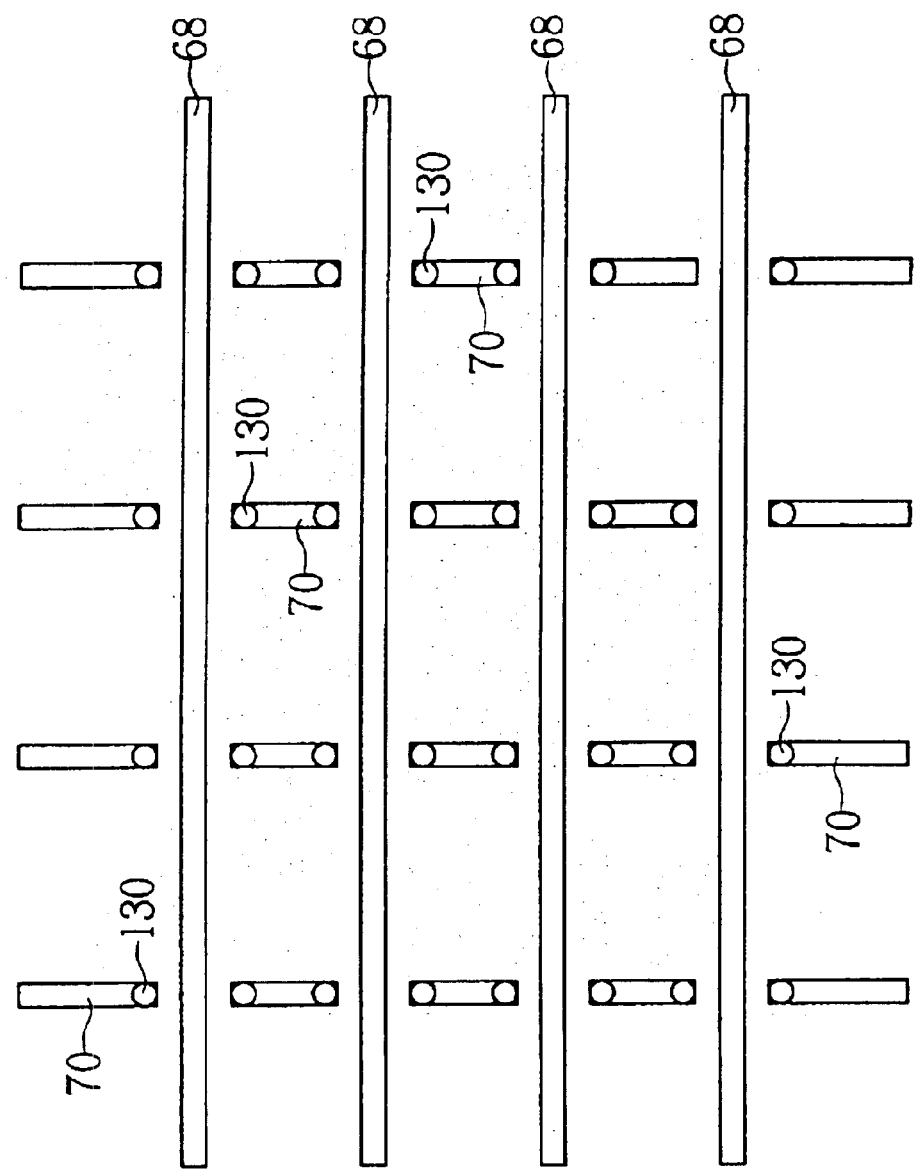

As shown in FIGS. 19–21, an interlayer dielectric 124 having a thickness about 1000 Å to 5000 Å is formed on the glass substrate 60. Then a fifth photo-etching process is performed to form via holes 126, which reach the source layers 112s and 114s, and the drain layers 112d and 114d, in the interlayer dielectric 124. Furthermore, a gap 128 is formed in the metal conductive wire 122, and a plurality of contact holes 130 are formed in two ends of the data lines 70 simultaneously in the preferred embodiment of the present invention. The material of the interlayer dielectric 124 comprises silicon oxide or silicon nitride.

Figure 22:
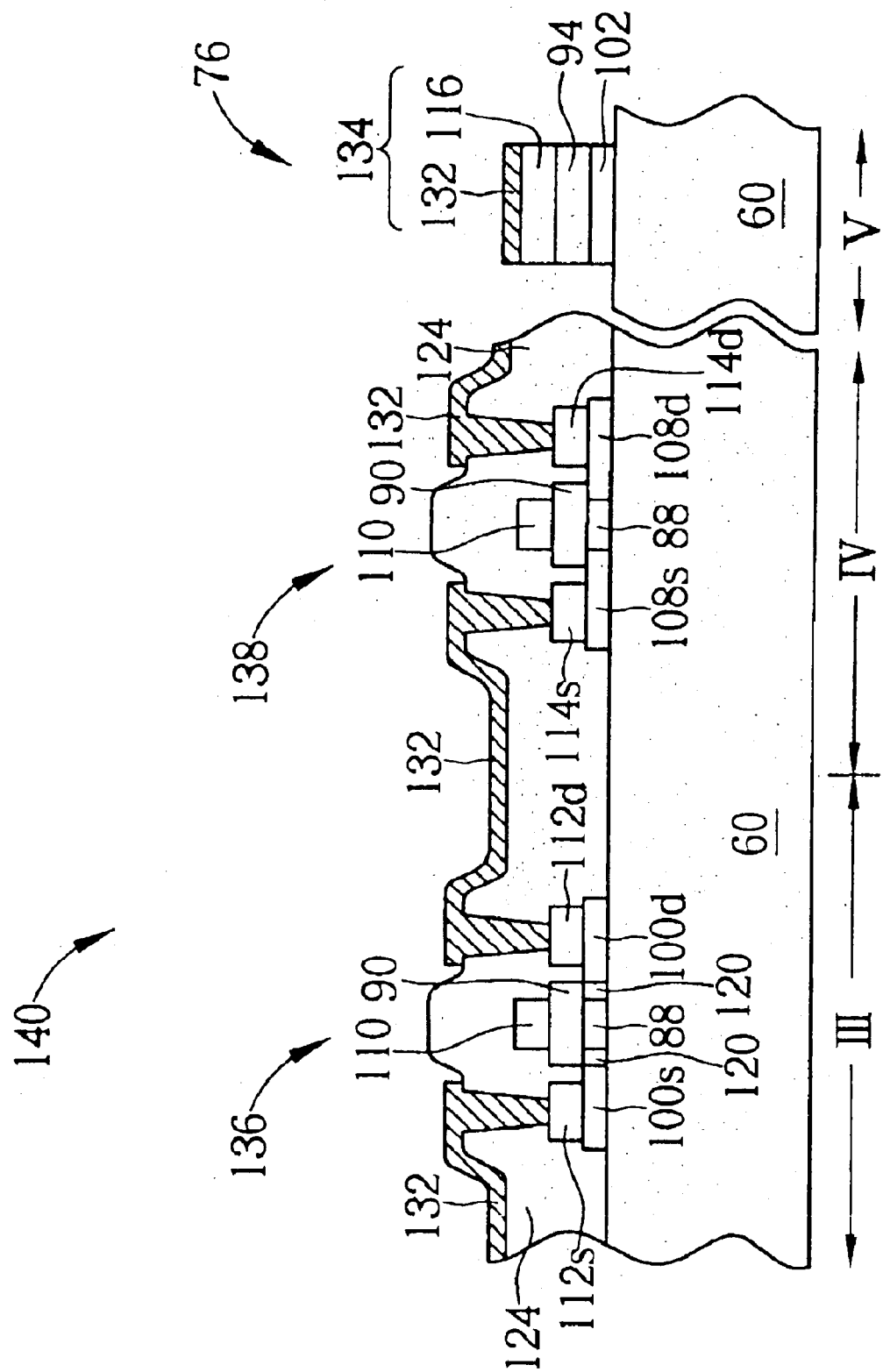
Figure 23:
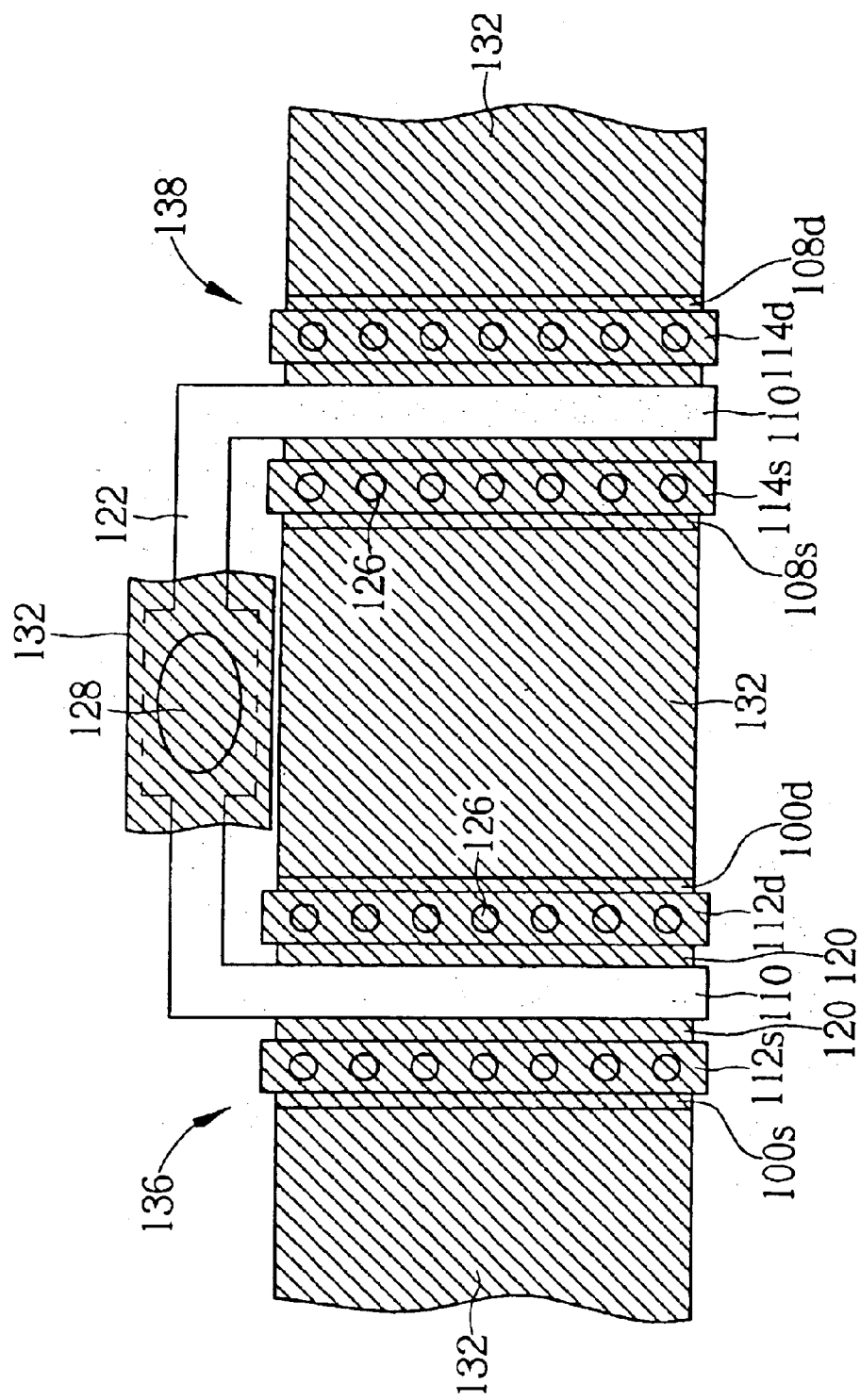
Figure 24:
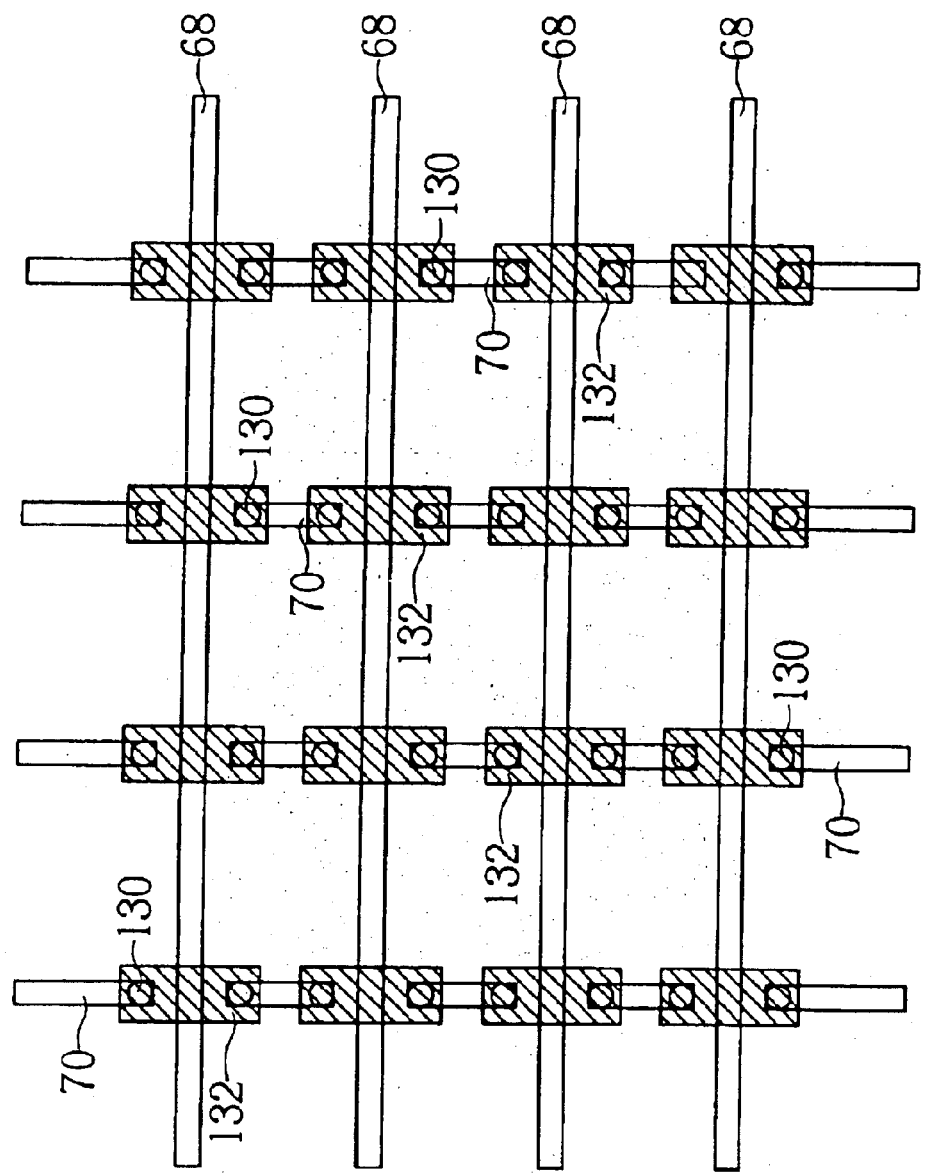

Finally, as shown in FIGS. 22–24, a transparent conductive layer (not shown), such as ITO or IZO, is formed on the glass substrate 60 to fill the via holes 126, the gap 128, and the contact holes 130. Then a sixth photo-etching process is performed to remove parts of the transparent conductive layer, such that a patterned transparent conductive layer 132 is formed on both the NMOS TFT region III and the PMOS TFT region IV, and a transparent conductive layer 132 of the storage capacitor 76 is formed simultaneously on the storage capacitor region V. The top capacitor dielectric layer 94 and the transparent conductive layer 132 form a top plate 134 of the capacitor 76. In addition, each discontinuous data line 70 is connected by the transparent conductive layer 132 for accomplishing the LTPS CMOS TFT 140 of the present invention.

It is noted that the gate electrodes 110, the source layers 112s and 114s, and the drain layers 112d and 114d can be alternatively formed in different steps. The steps are described as follows. First a first conductive layer is formed on the glass substrate, and a photo-etching process is performed to form two gate electrodes in the conductive layer above the gate insulating layer. Then a dielectric layer is formed on the glass substrate, and another photo-etching process is performed to form a plurality of contact holes in the dielectric layer above the two N type heavily doped areas and the two P type heavily doped areas. Afterward, a second conductive layer is formed on the glass substrate and filled into the contact holes. Finally, another photo-etching process is performed to form two source layers and two drain layers in the second conductive layer.

In contrast to the prior art, the present invention utilizes six photo-etching processes to respectively define the patterned polysilicon layer and the gate insulating layer, the source and drain of the NMOS TFT, the source and drain of the PMOS TFT, the gate electrode, source layer, drain layer, and lightly doped drain of the NMOS TFT, the via holes of the interlayer dielectric, and the pattern of the transparent conductive layer. Furthermore, the present invention provides a method for forming a lightly doped drain that can be self-aligned, such that the alignment deviation problem can be avoided because of less photo-etching processes are performed.

Those skilled in the art will readily appreciate that numerous modifications and alterations of the device may be made without departing from the scope of the present invention. Accordingly, the above disclosure should be construed as limited only by the metes and bounds of the appended claims.

What is claimed is:

1. A method for forming a low temperature polysilicon complementary metal oxide semiconductor thin film transistor (LTPS CMOS TFT) on a substrate, the substrate surface comprising a first region for forming a first type MOS TFT and a second region for forming a second type MOS TFT, the method comprising the steps of:

forming a patterned undoped polysilicon layer on both the first region and the second region of the substrate;

forming a gate insulating layer on each patterned undoped polysilicon layer;

forming two first type doped areas in the patterned polysilicon layer of the first region that is not covered by the gate insulating layer;

forming two second type doped areas in the patterned polysilicon layer of the second region that is not covered by the gate insulating layer;

forming a gate electrode on each gate insulating layer, and forming a source layer and a drain layer on both the first type doped areas and both the second type doped areas;

forming two first type lightly doped drain (LDD) areas in the patterned undoped polysilicon layer of the first region that is not covered by the gate electrode, the source layer, and the drain layer;

forming a patterned interlayer dielectric (ILD) on the substrate, the patterned interlayer dielectric comprising a plurality of via holes formed on each source layer and each drain layer; and filling a transparent conductive layer into the via holes.

2. The method of claim 1, wherein the substrate is a glass substrate or a quartz substrate.

3. The method of claim 1, wherein the first type is N type and the second type is P type.

4. The method of claim 3, wherein the LTPS MOS TFT is installed in a peripheral region of an LCD as a driving element, and the LCD further includes a pixel array region comprising a plurality of first type TFT and a plurality of storage capacitors.

5. The method of claim 4, wherein the substrate surface further comprises a third region for forming the storage capacitors.

6. The method of claim 1, wherein the step of forming the two patterned undoped polysilicon layers and the two gate insulating layers further comprises:

forming an undoped polysilicon layer and a first dielectric layer; and performing a first photo-etching process (PEP), which comprises:

forming a first photo resist layer on the substrate;

performing a photo process by an attenuating phase shift mask for forming a first patterned photo resist layer in the first photo resist layer on both the first region and the second region, wherein each first patterned photo resist layer includes a central region and two edge regions, and the thickness of the two edge regions are smaller than the thickness of the central region;

removing the first dielectric layer that is not covered by the two first patterned photo resist layers;

removing the two edge regions of each first patterned photo resist layer;

removing the first dielectric layer that is not covered by the central region of the two first photo resist layers, and simultaneously removing parts of the undoped polysilicon layer to form the two patterned undoped polysilicon layers and the two gate insulating layers on the substrate; and removing the central region of the two first patterned photo resist layers.

7. The method of claim 6, wherein a buffer layer exists between the substrate and the undoped polysilicon layer.

8. The method of claim 1, wherein the step of forming the two first type doped areas further comprises:

forming a second photo-resist layer on the substrate;

performing a second photo-etching process to form a second patterned photo resist layer in the second photo resist layer to cover the second region and the gate insulating layer of the first region;

performing a first implantation process by utilizing the second patterned photo resist as a mask to form the two first type doped areas in the patterned undoped polysilicon layer of the first region that is not covered by the second patterned photo resist layer; and removing the second patterned photo resist layer.

9. The method of claim 8, wherein the dopant concentration in the first implantation process is about 1E14 to 1E16 atoms/cm$^2$.

10. The method of claim 1, wherein the step of forming the two second type doped areas further comprises:

forming a third photo resist layer on the substrate;

performing a third photo-etching process to form a third patterned photo resist layer in the third photo resist layer to cover the first region and parts of the gate insulating layer of the second region;

performing a second implantation process by utilizing the third patterned photo resist layer as a mask to form the two second type doped areas in the patterned undoped polysilicon layer of the second region that is not covered by the third patterned photo resist layer; and removing the third patterned photo resist layer.

11. The method of claim 10, wherein the dopant concentration in the second implantation process is about 1E14 to 1E16 atoms/cm$^2$.

12. The method of claim 10, wherein the two second type doped areas overlap parts of the gate insulating layer in the second region.

13. The method of claim 1, wherein the two first type doped areas are a source and a drain of the first type MOS TFT, and the two second type doped areas are a source and a drain of the second type MOS TFT.

14. The method of claim 1, wherein the step of forming the two gate electrodes, the two source layers, and the two drain layers further comprises:

forming a first conductive layer on the substrate; and performing a fourth photo-etching process to form the two gate electrodes in the first conductive layer on the two gate insulating layers, and simultaneously form the two source layers and the two drain layers in the first conductive layer on both the two first type doped areas and the two second type doped areas.

15. The method of claim 14, wherein the material of the first conductive layer is selected from the group consisting of aluminum, tungsten, and chromium.

16. The method of claim 14, wherein the step of forming the two gate electrodes, the two source layers, and the two drain layers further comprises forming a metal conductive wire between the first type MOS TFT and the second type MOS TFT for connecting the gate electrode of the first type MOS TFT and the gate electrode of the second type MOS TFT.

17. The method of claim 16, wherein the material of the metal conductive wire is selected from the group consisting of aluminum, tungsten, and chromium.

18. The method of claim 14, wherein the step of forming the patterned interlayer dielectric and the via holes further comprises:

forming a interlayer dielectric on the substrate; and performing a fifth photo-etching process to form the via holes in the interlayer dielectric on the two source layers and the two drain layers respectively.

19. The method of claim 18, wherein the material of the interlayer dielectric comprises silicon oxide or silicon nitride.

20. The method of claim 18, wherein the step of forming the via holes further comprises forming a gap in the metal conductive wire.

21. The method of claim 18, wherein the step of filling the transparent conductive layer into the via holes further comprises:

forming a transparent conductive layer on the substrate and filling the transparent conductive layer into the via holes; and performing a sixth photo-etching process to remove the transparent conductive layer covering the two gate electrodes.

22. The method of claim 21, wherein when the transparent conductive layer is filled into the via holes, the transparent conductive layer is also filled into the gap.

23. The method of claim 21, wherein the step of forming the two gate electrodes, the two source layers, and the two drain layers further comprises forming a plurality of scan lines and a plurality of data lines orthogonal to the scan lines on the substrate.

24. The method of claim 23, wherein each scan line is a continuous scan line, each data line is a discontinuous data line, and each data line is connected by the transparent conductive layer.

25. The method of claim 23, wherein each data line is a continuous data line, each scan line is a discontinuous scan line, and each scan line is connected by the transparent conductive layer.

26. The method of claim 23, wherein the material of the scan lines and the data lines is selected from the group consisting of aluminum, tungsten, and chromium.

27. The method of claim 1, wherein the width of each gate electrode is smaller than the width of the gate insulating layer located below the gate electrode, and the width of each source layer and each drain layer is smaller than the width of the doped area located below the source layer and the drain layer.

28. The method of claim 1, wherein the step of forming the two lightly doped drain areas utilizes the gate electrode, the source layer, and the drain layer of the first region as a mask to perform a third implantation process to form the two first type lightly doped drains in the patterned undoped polysilicon layer that is not covered by the gate electrode, the source layer, and the drain layer of the first region.

29. The method of claim 28, wherein the dopant concentration in the third implantation process is about 1E12 to 1E14 atoms/cm$^2$.

30. The method of claim 1, wherein the step of forming the two gate electrodes, the two sources, and the two drains further comprises:

forming a second conductive layer on the substrate;

performing a seventh photo-etching process to form the two gate electrodes in the second conductive layer on the two gate insulating layers, the width of each gate electrode being smaller than the width of the gate insulating layer below the gate electrode;

forming a second dielectric layer on the substrate;

performing a eighth photo-etching process to form a plurality of contact holes in the second dielectric layer located on the two first type doped areas and the two second type doped areas;

forming a third conductive layer on the substrate and filling the third conductive layer into the contact holes; and performing a ninth photo-etching process to form the two source layers and the two drain layers in the third conductive layer, the width of each source layer and each drain layer being smaller than the width of the doped area located below each source layer and each drain layer.

31. The method of claim 30, wherein the material of the second conductive layer and the third conductive layer is selected from the group consisting of aluminum, tungsten, and chromium.

* * * * *